(12) United States Patent
Ko et al.

(10) Patent No.: US 10,786,995 B2
(45) Date of Patent: *Sep. 29, 2020

(54) INK DELIVERY SYSTEMS AND METHODS

(71) Applicant: KATEEVA, INC., Newark, CA (US)

(72) Inventors: Alexander Sou-Kang Ko, Santa Clara, CA (US); Stephen Mark Smith, Morgan Hill, CA (US); Shandon Alderson, San Carlos, CA (US)

(73) Assignee: Kateeva, Inc., Newark, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/577,514

(22) Filed: Sep. 20, 2019

(65) Prior Publication Data

US 2020/0009873 A1 Jan. 9, 2020

Related U.S. Application Data

(63) Continuation of application No. 16/025,999, filed on Jul. 2, 2018, now Pat. No. 10,434,782, which is a (Continued)

(51) Int. Cl.
*B41J 2/175* (2006.01)
*B41J 2/165* (2006.01)
(Continued)

(52) U.S. Cl.
CPC ........... *B41J 2/175* (2013.01); *B41J 2/16532* (2013.01); *B41J 2/16585* (2013.01); *B41J 29/02* (2013.01); *B41J 29/13* (2013.01)

(58) Field of Classification Search
CPC .... B41J 2/175; B41J 2/17503; B41J 2/17506; B41J 2/17509; B41J 2/17566; B41J 29/02; B41J 29/13
See application file for complete search history.

(56) References Cited

U.S. PATENT DOCUMENTS 5,953,030 A 9/1999 Ishinaga et al.
6,010,212 A 1/2000 Yamashita et al.
(Continued)

FOREIGN PATENT DOCUMENTS

CN 1693082 A 11/2005
TW 201404615 A 2/2014
WO 2015195493 A1 12/2015

OTHER PUBLICATIONS

EP Search Report dated Feb. 26, 2019, to EP Patent Application No. 16833649.3.
(Continued)

*Primary Examiner* — Anh T Vo
(74) *Attorney, Agent, or Firm* — Paula J. Tostado

(57) ABSTRACT

A method for printing a substrate may comprise positioning a substrate within an enclosure enclosing a printing system, wherein the printing system comprises a printhead device assembly comprising at least one printhead, and performing a printing process on the substrate. and. The printing process may comprise supplying ink from a local ink dispensing reservoir to the printhead device assembly, the local ink dispensing reservoir located inside the enclosure; supplying ink from a local ink replenishment reservoir to the local ink dispensing reservoir so as to maintain, in the local ink dispensing reservoir, a level of ink within a first predetermined range, the local ink dispensing reservoir located inside the enclosure; supplying ink from a bulk ink delivery system, through a fluid line disposed inside an outer conduit, and to the local ink replenishment reservoir so as to maintain, in the local ink replenishment reservoir, a level of ink within a second predetermined range, the bulk ink delivery system located outside the enclosure; and depositing ink from the at least one printhead on the substrate

22 Claims, 20 Drawing Sheets

Related U.S. Application Data continuation of application No. 15/224,320, filed on Jul. 29, 2016, now Pat. No. 10,035,351.

(60) Provisional application No. 62/199,906, filed on Jul. 31, 2015.

(51) Int. Cl.
*B41J 29/13* (2006.01)
*B41J 29/02* (2006.01)

(56) References Cited

U.S. PATENT DOCUMENTS

| | | |
|---|---|---|
| 6,270,207 B1 | 8/2001 | Sasaki |
| 6,312,083 B1 | 11/2001 | Moore |
| 6,520,630 B1 | 2/2003 | Oda et al. |
| 6,910,762 B2 | 6/2005 | Nakamura |
| 7,077,513 B2 | 7/2006 | Kimura et al. |
| 7,824,023 B2 | 11/2010 | Izawa et al. |
| 8,556,395 B2 | 10/2013 | Hiratsuka et al. |
| 8,899,171 B2 | 12/2014 | Mauck et al. |
| 9,365,046 B2 | 6/2016 | Sugitani et al. |
| 10,035,351 B2 | 7/2018 | Ko et al. |
| 10,434,782 B2 | 10/2019 | Ko et al. |
| 2008/0308037 A1 | 12/2008 | Bulovic et al. |
| 2009/0040249 A1* | 2/2009 | Wouters ............... B41J 2/1707 347/7 |
| 2009/0284563 A1 | 11/2009 | Bansyo |
| 2010/0053279 A1* | 3/2010 | Tamaki ............... B41J 2/175 347/85 |
| 2010/0201749 A1 | 8/2010 | Somekh et al. |
| 2012/0188314 A1* | 7/2012 | Akiyama ............... B41J 2/175 347/85 |
| 2013/0206058 A1 | 8/2013 | Mauck et al. |
| 2013/0228314 A1 | 9/2013 | Bernstein |
| 2013/0321535 A1 | 12/2013 | Mauck et al. |
| 2014/0184683 A1 | 7/2014 | Harjee et al. |
| 2014/0253616 A1 | 9/2014 | Tremel |
| 2014/0290567 A1 | 10/2014 | Mauck et al. |
| 2014/0311405 A1 | 10/2014 | Mauck et al. |
| 2017/0028731 A1 | 2/2017 | Ko et al. |
| 2018/0326732 A1 | 11/2018 | Ko et al. |

OTHER PUBLICATIONS

Examination Report dated Jun. 10, 2019 to TW Application No. 105124299.
Final Office Action dated Oct. 17, 2017 in U.S. Appl. No. 15/224,320.
International Search Report and Written Opinion dated Oct. 7, 2016 in PCT/US2016/044896.
Non-Final Office Action dated Mar. 24, 2017 in U.S. Appl. No. 15/224,320.
Non-Final Office Action dated Feb. 27, 2019 in U.S. Appl. No. 16/025,999.
Office Action dated Feb. 2, 2019 in CN Patent Application No. 201680045039.2.
Second Office Action dated Jun. 25, 2019 for CN Application No. 201680045039.2.
Notice of Allowance dated Mar. 28, 2018, to U.S. Appl. No. 15/224,320.
Notice of Allowance dated Jun. 6, 2019 for U.S. Appl. No. 16/025,999.

* cited by examiner

INK DELIVERY SYSTEMS AND METHODS

CROSS REFERENCE TO RELATED CASES

This application is a continuation of U.S. application Ser. No. 16/025,999, filed Jul. 2, 2018, which is a continuation of U.S. patent application Ser. No. 15/224,320, filed Jul. 29, 2016, (now U.S. Pat. No. 10,035,351, issued Jul. 31, 2018). U.S. application Ser. No. 15/224,320 claims benefit to U.S. Provisional Application No. 62/199,906, filed Jul. 31, 2015. Each of the aforementioned applications is incorporated herein by reference in its entirety.

OVERVIEW

Various embodiments of a printing system according to the present teachings can be useful for patterned area printing of substrates in the manufacture of a variety of devices and apparatuses in a wide range of technology areas, for example, but not limited by, OLED displays, OLED lighting, organic photovoltaics, Perovskite solar cells, and organic semiconductor circuits.

The non-limiting example of OLED display technologies presents a variety of fabrication challenges that can utilize the features of various embodiments of printing systems according to the present teachings. Interest in the potential of organic light-emitting diode (OLED) display technology has been driven by OLED display technology attributes that include demonstration of display panels that have highly saturated colors, are high-contrast, ultrathin, fast-responding, and energy efficient. Additionally, a variety of substrate materials, including flexible polymeric materials, can be used in the fabrication of OLED display technology. Though the demonstration of displays for small screen applications, primarily for cell phones, has served to emphasize the potential of the technology, challenges remain in scaling high volume manufacturing across a range of substrate formats in high yield.

With respect to scaling of formats, a Gen 5.5 substrate has dimensions of about 130 cm×150 cm and can yield about eight 26" flat panel displays. In comparison, larger format substrates can include using Gen 7.5 and Gen 8.5 mother glass substrate sizes. A Gen 7.5 mother glass has dimensions of about 195 cm×225 cm, and can be cut into eight 42" or six 47" flat panel displays per substrate. The mother glass used in Gen 8.5 is approximately 220 cm×250 cm, and can be cut to six 55" or eight 46" flat panel displays per substrate. One indication of the challenges that remain in scaling of OLED display manufacturing to larger formats is that the high-volume manufacture of OLED displays in high yield on substrates larger than Gen 5.5 substrates has proven to be substantially challenging.

In principle, an OLED device may be manufactured by the printing of various organic thin films, as well as other materials, on a substrate using a printing system. Such organic materials can be susceptible to damage by oxidation and other chemical processes. Housing a printing system in a fashion that can be scaled for various substrate sizes and can be done in an inert, substantially low-particle printing environment can present a variety of engineering challenges. Manufacturing tools for high throughput large-format substrate printing, for example, such as printing of Gen 7.5 and Gen 8.5 substrates, require substantially large facilities. Accordingly, maintaining a large facility under an inert atmosphere, requiring gas purification to remove reactive atmospheric species, such as water vapor, oxygen and ozone, as well as organic solvent vapors, as well as maintaining a substantially low-particle printing environment, has proven to be significantly challenging.

As such, challenges remain in scaling high volume manufacturing for technologies that can utilize a controlled environment, across a range of substrate formats in high yield. Accordingly, there exists a need for various embodiments of a printing system that can be enclosed in an inert, substantially low-particle environment, and can be readily scaled on a variety of substrates sizes and substrate materials used in, for example, but not limited by, OLED display, OLED lighting, organic photovoltaics, Perovskite solar cells, and organic semiconductor circuit technologies.

BRIEF DESCRIPTION OF THE DRAWINGS

A better understanding of the features and advantages of the present disclosure will be obtained by reference to the accompanying drawings, which are intended to illustrate, not limit, the present teachings. In the drawings, which are not necessarily drawn to scale, like numerals may describe similar components in different views. Like numerals having different letter suffixes may represent different instances of similar components.

DETAILED DESCRIPTION OF THE DISCLOSURE

The present teachings disclose various embodiments of a printing system for printing a substrate, in which the printing system can be housed in a gas enclosure, where the environment within the enclosure can be maintained as a controlled printing environment. A controlled environment of the present teachings can include control of the type of gas environment within the gas enclosure, the size and level particulate matter within the enclosure, control of the temperature within the enclosure and control of lighting. Various embodiments of a printing system of the present teachings can include a bulk ink delivery system that can be external to a gas enclosure. A bulk ink delivery system according to the present teachings can supply ink to a local ink delivery system that is internal to the gas enclosure. Various embodiments of a local ink delivery system of the present teachings can be proximal to a printhead device assembly, and can include a two-stage ink supply having a local ink replenishment reservoir that is configured to supply ink to a local ink dispensing reservoir to a constant level. According to the present teachings, a local ink dispensing reservoir can be in flow communication with a plurality of printhead devices. As such, a two-stage local ink delivery system maintaining a constant level in a local ink dispensing reservoir can provide constant head pressure to the plurality of printhead devices.

Various embodiments of a gas enclosure assembly can be sealably constructed and integrated with various components that provide a gas circulation and filtration system, a particle control system, a gas purification system, and a thermal regulation system and the like to form various embodiments of a gas enclosure system that can sustain an inert gas environment that is substantially low-particle for processes requiring such an environment. Various embodiments of a gas enclosure can have a printing system enclosure and an auxiliary enclosure constructed as a section of a gas enclosure assembly, which can be sealably isolated from the printing system enclosure of a gas enclosure. Various embodiments of a printing system of the present teachings can have a printhead management system enclosed in an auxiliary enclosure. Embodiments of printhead management system of the present teachings can include various devices and apparatuses for maintenance and calibration of a printhead; the various devices and apparatuses each mounted on a motion system platform for the fine positioning of the various devices and apparatuses relative to a printhead.

Figure 2:
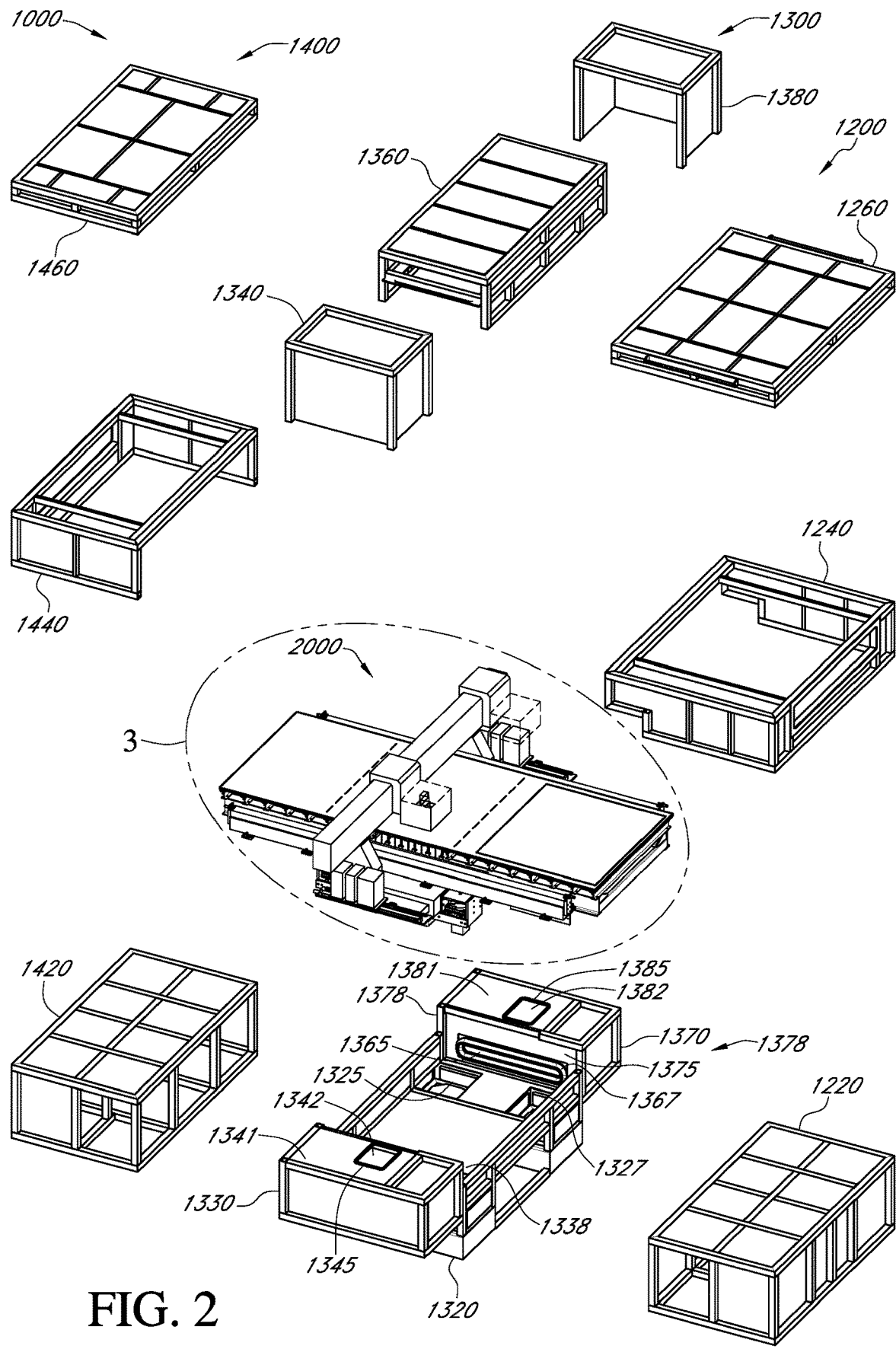
FIG. 2 illustrates generally an exploded view of various embodiments of a gas enclosure assembly as depicted in FIG. 1.
Figure 3:
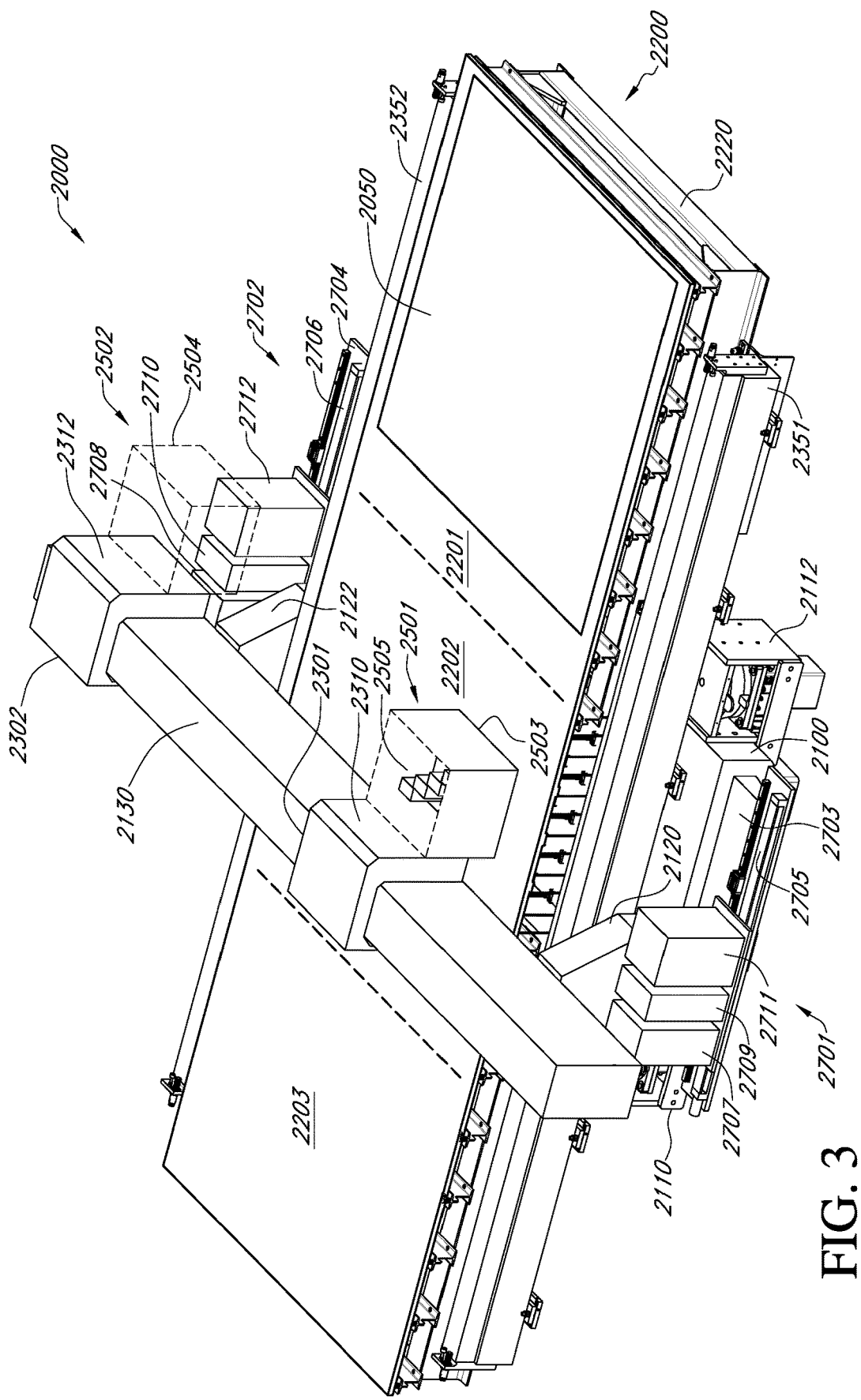
FIG. 3 is an expanded perspective view that illustrates generally the printing system depicted in FIG. 2.

A printing system, such as printing system 2000 of FIG. 2, shown in expanded view in FIG. 3, can be comprised of several devices and apparatuses, which allow the reliable placement of ink drops onto specific locations on a substrate. Printing requires relative motion between the printhead device assembly that can include a plurality of printheads and the substrate. This can be accomplished with a motion system, typically a gantry or split axis XYZ system. Either the printhead device assembly can move over a stationary substrate (gantry style), or both the printhead and substrate can move, in the case of a split axis configuration. In another embodiment, a printhead device assembly can be substantially stationary; for example, in the X and Y axes, and the substrate can move in the X and Y axes relative to the printheads, with Z axis motion provided either by a substrate support apparatus or by a Z-axis motion system associated with a printhead device assembly. As the printheads move relative to the substrate, droplets of ink are ejected at the correct time to be deposited in the desired location on a substrate. A substrate can be inserted and removed from the printer using a substrate loading and unloading system. Depending on the printer configuration, this can be accomplished with a mechanical conveyor, a substrate floatation table with a conveyance assembly, or a substrate transfer robot with end effector. For various embodiments of systems and methods of the present teachings, an Y-axis motion system can be based on an air-bearing gripper system.

For clearer perspective regarding substrate sizes that can be used in manufacturing of various display devices, generations of mother glass substrate sizes have been undergoing evolution for flat panel displays fabricated by other-than OLED printing since about the early 1990s. The first generation of mother glass substrates, designated as Gen 1, is approximately 30 cm×40 cm, and therefore could produce a 15" panel. Around the mid-1990s, the existing technology for producing flat panel displays had evolved to a mother glass substrate size of Gen 3.5, which has dimensions of about 60 cm×72 cm. In comparison, a Gen 5.5 substrate has dimensions of about 130 cm×150 cm.

As generations have advanced, mother glass sizes for Gen 7.5 and Gen 8.5 are in production for other-than OLED printing fabrication processes. A Gen 7.5 mother glass has dimensions of about 195 cm×225 cm, and can be cut into eight 42" or six 47" flat panels per substrate. The mother glass used in Gen 8.5 is approximately 220×250 cm, and can be cut to six 55" or eight 46" flat panels per substrate. The promise of OLED flat panel display technologies for qualities such as truer color, higher contrast, thinness, flexibility, transparency, and energy efficiency have been realized, at the same time that OLED manufacturing is practically limited to G 3.5 and smaller. Currently, OLED printing is believed to be the optimal manufacturing technology to break this limitation and enable OLED panel manufacturing for not only mother glass sizes of Gen 3.5 and smaller, but at the largest mother glass sizes, such as Gen 5.5, Gen 7.5, and Gen 8.5. One of the features of OLED panel display technology includes that a variety of substrate materials can be used, for example, but not limited by, a variety of glass substrate materials, as well as a variety of polymeric substrate materials. In that regard, sizes recited from the terminology arising from the use of glass-based substrates can be applied to substrates of any material suitable for use in OLED printing.

Manufacturing tools that in principle can allow for the printing of a variety of substrate sizes that includes large-format substrate sizes, can require substantially large facilities for housing such manufacturing tools. Accordingly, maintaining an entire large facility under an inert atmosphere presents engineering challenges, such as continual purification of a large volume of an inert gas. Various embodiments of a gas enclosure system can have a circulation and filtration system internal a gas enclosure assembly in conjunction with a gas purification system external a gas enclosure that together can provide continuous circulation of a substantially low-particulate inert gas having substantially low levels of reactive species throughout a gas enclosure system. According to the present teachings, an inert gas may be any gas that does not undergo a chemical reaction under a defined set of conditions. Some commonly used non-limiting examples of an inert gas can include nitrogen, any of the noble gases, and any combination thereof. Additionally, providing a large facility that is essentially hermetically sealed to prevent contamination of various reactive atmospheric gases, such as water vapor, oxygen and ozone, as well as organic solvent vapors generated from various printing process poses an engineering challenge. According to the present teachings, a printing facility would maintain levels for each species of various reactive species, including various reactive atmospheric gases, such as water vapor, oxygen and ozone, as well as organic solvent vapors at 100 ppm or lower, for example, at 10 ppm or lower, at 1.0 ppm or lower, or at 0.1 ppm or lower.

The need for printing an OLED panel in a facility in which the levels of each of a reactive species should be maintained at targeted low levels can be illustrated in reviewing the information summarized in Table 1. The data summarized on Table 1 resulted from the testing of each of a test coupon comprising organic thin film compositions for each of red, green, and blue, fabricated in a large-pixel, spin-coated device format. Such test coupons are substantially easier to fabricate and test for the purpose of rapid evaluation of various formulations and processes. Though test coupon testing should not be confused with lifetime testing of a printed panel, it can be indicative of the impact of various formulations and processes on lifetime. The results shown in the table below represent variation in the process step in the fabrication of test coupons in which only the spin-coating environment varied for test coupons fabricated in a nitrogen environment where reactive species were less than 1 ppm compared to test coupons similarly fabricated but in air instead of a nitrogen environment.

It is evident through the inspection of the data in Table 1 for test coupons fabricated under different processing environments, particularly in the case of red and blue, that printing in an environment that effectively reduces exposure of organic thin film compositions to reactive species may have a substantial impact on the stability of various ELs, and hence on lifetime. The lifetime specification is of particular significance for OLED panel technology, as this correlates directly to display product longevity; a product specification for all panel technologies, which has been challenging for OLED panel technology to meet. In order to provide panels meeting requisite lifetime specifications, levels of each of a reactive species, such as water vapor, oxygen, and ozone, as well as organic solvent vapors, can be maintained at 100 ppm or lower, for example, at 10 ppm or lower, at 1.0 ppm or lower, or at 0.1 ppm or lower with various embodiments of a gas enclosure system of the present teachings.

TABLE 1

Impact of inert gas processing on lifetime for OLED panels

| Color | Process Environment | V @ 10 mA/cm$^2$ | Cd/A | CIE (x, y) @ 1000 Cd/m$^2$ | T95 | T80 | T50 |
|---|---|---|---|---|---|---|---|
| Red | Nitrogen | 6 | 9 | (0.61, 0.38) | 200 | 1750 | 10400 |
| | Air | 6 | 8 | (0.60, 0.39) | 30 | 700 | 5600 |
| Green | Nitrogen | 7 | 66 | (0.32, 0.63) | 250 | 3700 | 32000 |
| | Air | 7 | 61 | (0.32, 0.62) | 250 | 2450 | 19700 |
| Blue | Nitrogen | 4 | 5 | (0.14, 0.10) | 150 | 750 | 3200 |
| | Air | 4 | 5 | (0.14, 0.10) | 15 | 250 | 1800 |

In addition to providing an inert environment, maintaining a substantially low-particle environment for OLED printing is of particular importance, as even very small particles can lead to a visible defect on an OLED panel. Particle control in a gas enclosure system can present significant challenges not presented for processes that can be done, for example, in atmospheric conditions under open air, high flow laminar flow filtration hoods. For example, of a manufacturing facility can require a substantial length of various service bundles that can be operatively connected from various systems and assemblies to provide optical, electrical, mechanical, and fluidic connections required to operate, for example, but not limited by, a printing system. Such service bundles used in the operation of a printing system and located proximal to a substrate positioned for printing can be an ongoing source of particulate matter. Additionally, components used in a printing system, such as fans or linear motion systems that use friction bearing, can be particle generating components. Various embodiments of a gas circulation and filtration system of the present teachings can be used in conjunction with particle control components to contain and exhaust particulate matter. Additionally, by using a variety of intrinsically low-particle generating pneumatically operated components, such as, but not limited by, substrate floatation tables, air bearings, and pneumatically operated robots, and the like, a low particle environment for various embodiments of a gas enclosure system can be maintained.

Regarding maintaining a substantially low-particle environment, various embodiments of a gas circulation and filtration system can be designed to provide a low particle inert gas environment for airborne particulates meeting the standards of International Standards Organization Standard (ISO) 14644-1:1999, "Cleanrooms and associated controlled environments—Part 1: Classification of air cleanliness," as specified by Class 1 through Class 5. However, controlling airborne particulate matter alone is not sufficient for providing a low-particle environment proximal to a substrate during, for example, but not limited by, a printing process, as particles generated proximal to a substrate during such a process can accumulate on a substrate surface before they can be swept through a gas circulation and filtration system.

Accordingly, in conjunction with a gas circulation and filtration system, various embodiments of a gas enclosure system of the present teachings can have a particle control system that can include components that can provide a low-particle zone proximal to a substrate during processing in a printing step. A particle control system for various embodiments of a gas enclosure system of the present teachings can include a gas circulation and filtration system, a low-particle-generating X-axis linear bearing system for moving a printhead device assembly relative to a substrate, a service bundle housing exhaust system, and a printhead device assembly exhaust system. For example, a gas enclosure system can have a gas circulation and filtration system internal a gas enclosure assembly.

Various embodiments of systems and methods of the present teachings can maintain a substantially low-particle environment providing for an average on-substrate distribution of particles of a particular size range of interest that does not exceed an on-substrate deposition rate specification. An on-substrate deposition rate specification can be set for each of a particle size range of interest of between about 0.1 $\square$m and greater to about 10 $\square$m and greater. In various embodiments systems and methods of the present teachings, an on-substrate particle deposition rate specification can be expressed as a limit of the number of particles deposited per square meter of substrate per minute for each of a target particle size range.

Various embodiments of an on-substrate particle deposition rate specification can be readily converted from a limit of the number of particles deposited per square meter of substrate per minute to a limit of the number of particles deposited per substrate per minute for each of a target particle size range. Such a conversion can be readily done through a known relationship between substrates, for example, of a specific generation-sized substrate and the corresponding area for that substrate generation. For example, Table 2 below summarizes aspect ratios and areas for some known generation-sized substrates. It should be understood that a slight variation of aspect ratio and hence size may be seen from manufacturer to manufacturer. However, regardless of such variation, a conversion factor for a specific generation-sized substrate and an area in square meters can be obtained any of a variety of generation-sized substrates.

TABLE 2

Correlation between area and substrate size

| Generation ID | X (mm) | Y (mm) | Area (m2) |
|---|---|---|---|
| Gen 3.0 | 550 | 650 | 0.36 |
| Gen 3.5 | 610 | 720 | 0.44 |
| Gen 3.5 | 620 | 750 | 0.47 |
| Gen 4 | 680 | 880 | 0.60 |
| Gen 4 | 730 | 920 | 0.67 |
| Gen 5 | 1100 | 1250 | 1.38 |
| Gen 5 | 1100 | 1300 | 1.43 |
| Gen 5.5 | 1300 | 1500 | 1.95 |
| Gen 6 | 1500 | 1850 | 2.78 |
| Gen 7.5 | 1950 | 2250 | 4.39 |
| Gen 8 | 2160 | 2400 | 5.18 |
| Gen 8 | 2160 | 2460 | 5.31 |
| Gen 8.5 | 2200 | 2500 | 5.50 |
| Gen 9 | 2400 | 2800 | 6.72 |
| Gen 10 | 2850 | 3050 | 8.69 |

Additionally, an on-substrate particle deposition rate specification expressed as a limit of the number of particles deposited per square meter of substrate per minute can be readily converted to any of a variety of unit time expressions. It will be readily understood that an on-substrate particle deposition rate specification normalized to minutes can be readily converted to any other expression of time through know relationships of time, for example, but not limited by, such as second, hour, day, etc. Additionally, units of time specifically relating to processing can be used. For example, a print cycle can be associated with a unit of time. For various embodiments of a gas enclosure system according to the present teachings a print cycle can be a period of time in which a substrate is moved into a gas enclosure system for printing and then removed from a gas enclosure system after printing is complete. For various embodiments of a gas enclosure system according to the present teachings a print cycle can be a period of time from the initiation of the alignment of a substrate with respect to a printhead device assembly to the delivery of a last ejected drop of ink onto the substrate. In the art of processing, total average cycle time or TACT can be an expression of a unit of time for a particular process cycle. According to various embodiments of systems and methods of the present teachings, TACT for a print cycle can be about 30 seconds. For various embodiments of systems and methods of the present teachings, TACT for a print cycle can be about 60 seconds. In various embodiments of systems and methods of the present teachings, TACT for a print cycle can be about 90 seconds. For various embodiments of systems and methods of the present teachings, TACT for a print cycle can be about 120 seconds. In various embodiments of systems and methods of the present teachings, TACT for a print cycle can be about 300 seconds.

With respect to airborne particulate matter and particle deposition within a system, a substantial number of variables can impact developing a general model that may adequately compute, for example, an approximation of a value for particle fallout rate on a surface, such as a substrate, for any particular manufacturing system. Variables such as the size of particles, the distribution of particles of particular size; surface area of a substrate and the time of exposure of a substrate within a system can vary depending on various manufacturing systems. For example, the size of particles and the distribution of particles of particular size can be substantially impacted by the source and location of particle-generating components in various manufacturing systems. Calculations based on various embodiments of gas enclosure systems of the present teachings suggest that without various particle control systems of the present teachings, on-substrate deposition of particulate matter per print cycle per square meter of substrate can be between more than about 1 million to more than about 10 million particles for particles in a size range of 0.1 $\square$m and greater. Such calculations suggest that that without various particle control systems of the present teachings, on-substrate deposition of particulate matter per print cycle per square meter of substrate can be between more than about 1000 to about more than about 10,000 particles for particles in a size range of about 2 $\square$m and greater.

Various embodiments of a low-particle gas enclosure system of the present teachings can maintain a low-particle environment providing for an average on-substrate particle distribution that meets an on-substrate deposition rate specification of less than or equal to about 100 particles per square meter of substrate per minute for particles greater than or equal to 10 $\square$m in size. Various embodiments of a low-particle gas enclosure system of the present teachings can maintain a low-particle environment providing for an average on-substrate particle distribution that meets an on-substrate deposition rate specification of less than or equal to about 100 particles per square meter of substrate per minute for particles greater than or equal to 5 µm in size. In various embodiments of a gas enclosure system of the present teachings, a low-particle environment can be maintained providing for an average on-substrate particle distribution that meets an on-substrate deposition rate specification of less than or equal to about 100 particles per square meter of substrate per minute for particles greater than or equal to 2 µm in size. In various embodiments of a gas enclosure system of the present teachings, a low-particle environment can be maintained providing for an average on-substrate particle distribution that meets an on-substrate deposition rate specification of less than or equal to about 100 particles per square meter of substrate per minute for particles greater than or equal to 1 µm in size. Various embodiments of a low-particle gas enclosure system of the present teachings can maintain a low-particle environment providing for an average on-substrate particle distribution that meets an on-substrate deposition rate specification of less than or equal to about 1000 particles per square meter of substrate per minute for particles greater than or equal to 0.5 µm in size. For various embodiments of a gas enclosure system of the present teachings, a low-particle environment can be maintained providing for an average on-substrate particle distribution that meets an on-substrate deposition rate specification of less than or equal to about 1000 particles per square meter of substrate per minute for particles greater than or equal to 0.3 µm in size. Various embodiments of a low-particle gas enclosure system of the present teachings can maintain a low-particle environment providing for an average on-substrate particle distribution that meets an on-substrate deposition rate specification of less than or equal to about 1000 particles per square meter of substrate per minute for particles greater than or equal to 0.1 µm in size.

It is contemplated that a wide variety of ink formulations can be printed within the inert, substantially low-particle environment of various embodiments of a gas enclosure system of the present teachings. During the manufacture of an OLED display, an OLED pixel can be formed to include an OLED film stack, which can emit light of a specific peak wavelength when a voltage is applied. An OLED film stack structure between an anode and a cathode can include a hole injection layer (HIL), a hole transport layer (HTL), an emissive layer (EL), an electron transport layer (ETL) and an electron injection layer (EIL). In some embodiments of an OLED film stack structure, an electron transport layer (ETL) can be combined with an electron injection layer (EIL) to form an ETL/EIL layer. According to the present teachings, various ink formulations for an EL for various color pixel EL films of an OLED film stack can be printed using, for example, inkjet printing. Additionally, for example, but not limited by, the HIL, HTL, EML, and ETL/EIL layers can have ink formulations that can be printed using inkjet printing.

It is further contemplated that an organic encapsulation layer can be printed on a substrate printing. It is contemplated that an organic encapsulation layer can be printed using inkjet printing, as inkjet printing can provide several advantages. First, a range of vacuum processing operations can be eliminated because such inkjet-based fabrication can be performed at atmospheric pressure. Additionally, during an inkjet printing process, an organic encapsulation layer can be localized to cover portions of an OLED substrate over and proximal to an active region, to effectively encapsulate an active region, including lateral edges of the active region. The targeted patterning using inkjet printing results in eliminating material waste, as well as eliminating additional processing typically required to achieve patterning of an organic layer. An encapsulation ink can comprise a polymer including, for example, but not limited by, an acrylate, methacrylate, urethane, or other material, as well as copolymers and mixtures thereof, which can be cured using thermal processing (e.g. bake), UV exposure, and combinations thereof. As used herein polymer and copolymer can include any form of a polymer component that can be formulated into an ink and cured on a substrate to form an organic encapsulation layer. Such polymeric components can include polymers, and copolymers, as well as precursors thereof, for example, but not limited by, monomers, oligomers, and resins.

Various embodiments of a gas enclosure assembly can have various frame members that are constructed to provide contour for a gas enclosure assembly. Various embodiments of a gas enclosure assembly of the present teachings can accommodate a printing system, while optimizing the working space to minimize inert gas volume, and also allowing ready access to a printing system from the exterior during processing. In that regard, various gas enclosure assemblies of the present teachings can have a contoured topology and volume. As will be discussed in more detail subsequently herein, various embodiments of a gas enclosure can be contoured around a printing system base, upon which a substrate support apparatus can be mounted. Further, a gas enclosure can be contoured around a bridge structure of a printing system used for the X-axis movement of a carriage assembly. As a non-limiting example, various embodiments of a contoured gas enclosure according to the present teachings can have a gas enclosure volume of between about 6 $m^3$ to about 95 $m^3$ for housing various embodiments of a printing system capable of printing substrate sizes from Gen 3.5 to Gen 10. By way a further non-limiting example, various embodiments of a contoured gas enclosure according to the present teachings can have a gas enclosure volume of between about 15 $m^3$ to about 30 $m^3$ for housing various embodiments of a printing system capable of printing, for example, Gen 5.5 to Gen 8.5 substrate sizes. Such embodiments of a contoured gas enclosure can be between about 30% to about 70% savings in volume in comparison to a non-contoured enclosure having non-contoured dimensions for width, length and height.

Figure 1:
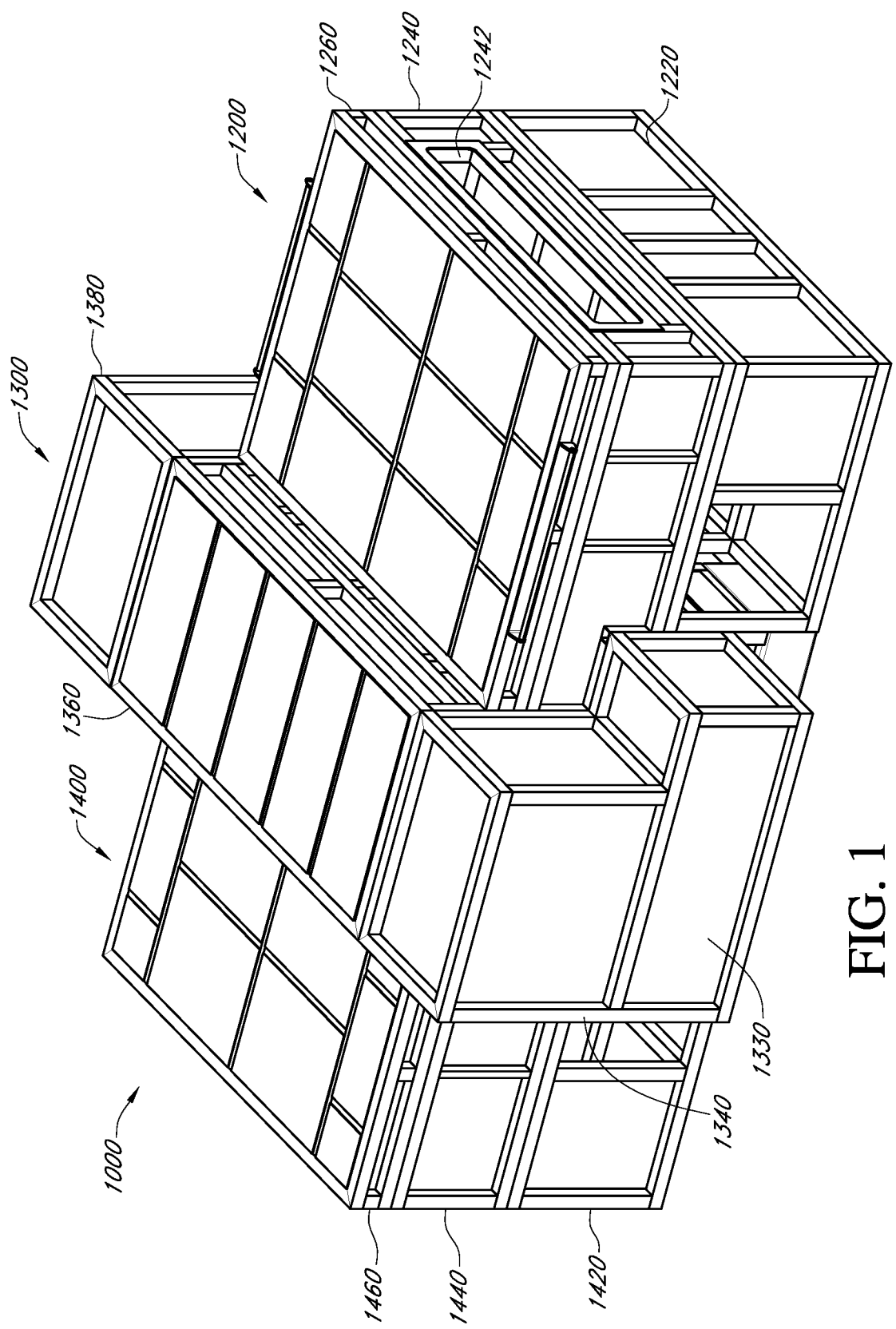
FIG. 1 illustrates generally a front perspective view of view of a gas enclosure assembly in accordance with various embodiments of the present teachings.

FIG. 1 depicts a perspective view gas enclosure assembly 1000 in accordance with various embodiments of a gas enclosure assembly of the present teachings. Gas enclosure assembly 1000 can include front panel assembly 1200, middle panel assembly 1300 and rear panel assembly 1400. Front panel assembly 1200 can include front ceiling panel assembly 1260, front wall panel assembly 1240, which can have opening 1242 for receiving a substrate, and front base panel assembly 1220. Rear panel assembly 1400 can include rear ceiling panel assembly 1460, rear wall panel assembly 1440 and rear base panel assembly 1420. Middle panel assembly 1300 can include first middle enclosure panel assembly 1340, middle wall and ceiling panel assembly 1360 and second middle enclosure panel assembly 1380, as well as middle base panel assembly 1320.

Additionally, as depicted in FIG. 1, middle panel assembly 1300 can house a first printhead management system within auxiliary enclosure 1330 system as well as a second printhead management system in auxiliary enclosure 1380. Such auxiliary enclosures can provide a controlled environment which can be the same or different from that of the remaining printing system enclosure portion of a gas enclosure housing of the present teachings. For example, various embodiments of an auxiliary enclosure can provide a substantially inert, low particle environment for housing various embodiments of a printhead management system. Various embodiments of an auxiliary enclosure constructed as a section of a gas enclosure assembly can be sealably isolated from the working volume of a gas enclosure system. For various embodiments of systems and methods of the present teachings, an auxiliary enclosure can be less than or equal to about 1% of the enclosure volume of a gas enclosure system. In various embodiments of systems and methods of the present teachings, an auxiliary enclosure can be can be less than or equal to about 2% of the enclosure volume of a gas enclosure system. For various embodiments of systems and methods of the present teachings, an auxiliary enclosure can be less than or equal to about 5% of the enclosure volume of a gas enclosure system. In various embodiments of systems and methods of the present teachings, an auxiliary enclosure can be less than or equal to about 10% of the enclosure volume of a gas enclosure system. In various embodiments of systems and methods of the present teachings, an auxiliary enclosure can be less than or equal to about 20% of the enclosure volume of a gas enclosure system. Should the opening of an auxiliary enclosure to an ambient environment containing reactive gases be indicated for performing, for example, a maintenance procedure, isolating an auxiliary enclosure from the working volume of a gas enclosure can prevent contamination of the entire volume of a gas enclosure. Further, given the relatively small volume of an auxiliary enclosure in comparison to the printing system enclosure portion of a gas enclosure, the recovery time for an auxiliary enclosure can take significantly less time than recovery time for an entire printing system enclosure.

As depicted in FIG. 2, gas enclosure assembly 1000 can include front base panel assembly 1220, middle base panel assembly 1320, and rear base panel assembly 1420, which when fully-constructed form a contiguous base or pan on which printing system 2000 can be mounted. In a similar fashion as described for gas enclosure assembly 100 of FIG. 1, the various frame members and panels comprising front panel assembly 1200, middle panel assembly 1300, and rear panel assembly 1400 of gas enclosure assembly 1000 can be joined around printing system 2000 to form a printing system enclosure. Front panel assembly 1200 can be contoured around printing system 2000 mounted to form a first tunnel enclosure section of a gas enclosure. Similarly, rear panel assembly 1400 can be contoured around printing system 2000 to form a second tunnel enclosure section of a gas enclosure. Additionally, middle panel assembly 1300 can be contoured around a bridge section of a printing system 2000 to form a bridge enclosure section of a gas enclosure. Together, a first tunnel enclosure section, a second tunnel section and a bridge enclosure section can form a printing system enclosure. As will be discussed in more detail herein, according to the present teachings, an auxiliary enclosure can be sealably isolated from a printing system enclosure during, for example, a printing process for performing various measurement and maintenance tasks, with little or no interruption to the printing process.

Further, a fully constructed gas enclosure assembly, such as gas enclosure assembly 1000, when integrated with various environmental control systems can form various embodiments of a gas enclosure system including various embodiments of a printing system, such as printing system 2000. According to various embodiments of a gas enclosure system of the present teachings, environmental control of an interior volume defined by a gas enclosure assembly can include control of lighting, for example, by the number and placement of lights of a specific wavelength, control of particulate matter using various embodiments of a particle control system, control of reactive gas species using various embodiments of a gas purification system, and temperature control of a gas enclosure assembly using various embodiments of a thermal regulation system.

A printing system, such as printing system 2000 of FIG. 2, shown in expanded view in FIG. 3, can be comprised of several devices and apparatuses, which allow the reliable placement of ink drops onto specific locations on a substrate. These devices and apparatuses can include, but are not limited to, a printhead device assembly, ink delivery system, a motion system for providing relative motion between a printhead device assembly and a substrate, substrate support apparatus, substrate loading and unloading system, and printhead management system.

A printhead device assembly can include at least one inkjet head, with at least one orifice capable of ejecting droplets of ink at a controlled rate, velocity, and size. The inkjet head is fed by an ink supply system which provides ink to the inkjet head. As shown in an expanded view of FIG. 3, printing system 2000 can have a substrate, such as substrate 2050, which can be supported by a substrate support apparatus, such as a chuck, for example, but not limited by, a vacuum chuck, a substrate floatation chuck having pressure ports, and a substrate floatation chuck having vacuum and pressure ports. In various embodiments of systems and methods of the present teachings, a substrate support apparatus can be a substrate floatation table. As will be discussed in more detail subsequently herein, substrate floatation table 2200 of FIG. 3 can be used for supporting substrate 2050, and in conjunction with a Y-axis motion system, can be part of a substrate conveyance system providing for the frictionless conveyance of substrate 2050. A Y-axis motion system of the present teachings can include first Y-axis support beam 2351 and second Y-axis support beam 2352, which can include a gripper system (not shown) for holding a substrate, as will be discussed in more detail herein. Y-axis motion can be provided by either a linear air bearing or linear mechanical system. Substrate floatation table 2200 of printing system 2000 shown in FIG. 2 and FIG. 3 can define the travel of substrate 2050 through gas enclosure assembly 1000 of FIG. 1 during a printing process.

FIG. 3 illustrates generally an example of substrate floatation table 2200 for a printing system 2000 that can include a floating conveyance of a substrate, which can have a porous medium to provide floatation. In the example of FIG. 3, a handler or other conveyance can be used to position a substrate 2050 in an input region 2201 of a substrate floatation table 2200, such as located on a conveyor. The conveyer can position the substrate 2050 at a specified location within the printing system such as using either mechanical contact (e.g., using an array of pins, a tray, or a support frame configuration), or using gas cushion to controllably float the substrate 2050 (e.g., an "air bearing" table configuration). A printing region 2202 of the substrate floatation table 2200 can be used to controllably deposit one or more layers on the substrate 2050 during fabrication. The printing region 2202 can also be coupled to an output region 2203 of the substrate floatation table 2200. The conveyer can extend along the input region 2201, the printing region 2202, and the output region 2203 of the substrate floatation table 2200, and the substrate 2050 can be repositioned as desired for various deposition tasks, or during a single deposition operation. The controlled environments nearby the input region 2201, the printing region 2202, and the output region 2203 can be commonly-shared.

The printing system 2000 of FIG. 3 can include one or more printhead devices 2505, each printhead device having one or more printheads; e.g. nozzle printing, thermal jet or ink-jet type. The one or more printhead devices 2505 can be coupled to or otherwise traversing an overhead carriage, such as first X-axis carriage assembly 2301. For various embodiments of printing system 2000 of the present teachings, one or more printheads of one or more printhead devices 2505 can be configured to deposit one or more patterned organic layers on the substrate 2050 in a "face up" configuration of the substrate 2050. Such layers can include one or more of an electron injection or transport layer, a hole injection or transport layer, a blocking layer, or an emission layer, for example. Such materials can provide one or more electrically functional layers.

According to the floatation schemes shown in FIG. 3, in an example where the substrate 2050 is supported exclusively by the gas cushion, a combination of positive gas pressure and vacuum can be applied through the arrangement of ports or using a distributed porous medium. Such a zone having both pressure and vacuum control can effectively provide a fluidic spring between the conveyor and a substrate. A combination of positive pressure and vacuum control can provide a fluidic spring with bidirectional stiffness. The gap that exists between the substrate (e.g., substrate 2050) and a surface can be referred to as the "fly height," and such a height can be controlled or otherwise established by controlling the positive pressure and vacuum port states. In this manner, the substrate Z-axis height can be carefully controlled in, for example, the printing region 2202. In some embodiments, mechanical retaining techniques, such as pins or a frame, can be used to restrict lateral translation of the substrate while the substrate is supported by the gas cushion. Such retaining techniques can include using spring loaded structures, such as to reduce the instantaneous forces incident the sides of the substrate while the substrate is being retained; this can be beneficial as a high force impact between a laterally translating substrate and a retaining means can cause substrate chipping or even catastrophic breakage.

Elsewhere, as illustrated generally in FIG. 3, such as where the fly height need not be controlled precisely, pressure-only floatation zones can be provided, such as along the conveyor in the input or output regions 2100 or 2300, or elsewhere. A "transition" zone can be provided such as where a ratio of pressure to vacuum nozzles increases or decreases gradually. In an illustrative example, there can be an essentially uniform height between a pressure-vacuum zone, a transition zone, and a pressure only zone, so that within tolerances, the three zones can lie essentially in one plane. A fly height of a substrate over pressure-only zones elsewhere can be greater than the fly height of a substrate over a pressure-vacuum zone, such as in order to allow enough height so that a substrate will not collide with a floatation table in the pressure-only zones. In an illustrative example, an OLED panel substrate can have a fly height of between about 150 micrometers ☐☐☐☐ to about 300☐ above pressure-only zones, and then between about 30☐ to about 50☐ above a pressure-vacuum zone. In an illustrative example, one or more portions of the substrate floatation table 2200 or other fabrication apparatus can include an "air bearing" assembly provided by NewWay® Air Bearings (Aston, Pa., United States of America).

A porous medium can be used to establish a distributed pressurized gas cushion for floating conveyance or support of the substrate 2050 during one or more of printing, buffering, drying, or thermal treatment. For example, a porous medium "plate" such as coupled to or included as a portion of a conveyor can provide a "distributed" pressure to support the substrate 2050 in a manner similar to the use of individual gas ports. The use of a distributed pressurized gas cushion without using large gas port apertures can in some instances further improve uniformity and reduce or minimize the formation of mura or other visible defects, such as in those instances where the use of relatively large gas ports to create a gas cushion leads to non-uniformity, in spite of the use of a gas cushion.

A porous medium can be obtained such as from Nano TEM Co., Ltd. (Niigata, Japan), such as having physical dimensions specified to occupy an entirety of the substrate 2050, or specified regions of the substrate such as display regions or regions outside display regions. Such a porous medium can include a pore size specified to provide a desired pressurized gas flow over a specified area, while reducing or eliminating mura or other visible defect formation.

Printing requires relative motion between the printhead device assembly and the substrate. This can be accomplished with a motion system, typically a gantry or split axis XYZ system. Either the printhead device assembly can move over a stationary substrate (gantry style), or both the printhead and substrate can move, in the case of a split axis configuration. In another embodiment, a printhead device assembly can be substantially stationary; for example, in the X and Y axes, and the substrate can move in the X and Y axes relative to the printheads, with Z axis motion provided either by a substrate support apparatus or by a Z-axis motion system associated with a printhead device assembly. As the printheads move relative to the substrate, droplets of ink are ejected at the correct time to be deposited in the desired location on a substrate. A substrate can be inserted and removed from the printer using a substrate loading and unloading system. Depending on the printer configuration, this can be accomplished with a mechanical conveyor, a substrate floatation table with a conveyance assembly, or a substrate transfer robot with end effector. A printhead management system can be comprised of several subsystems which allow for such measurement tasks, such as the checking for nozzle firing, as well as the measurement of drop volume, velocity and trajectory from every nozzle in a printhead, and maintenance tasks, such as wiping or blotting the inkjet nozzle surface of excess ink, priming and purging a printhead by ejecting ink from an ink supply through the printhead and into a waste basin, and replacement of printheads. Given the variety of components that can comprise a printing system, various embodiments of printing systems can have a variety of footprints and form factors.

With respect to FIG. 3, printing system base 2100, can include first riser 2120 and second riser 2122, upon which bridge 2130 is mounted. For various embodiments of printing system 2000, bridge 2130 can support first X-axis carriage assembly 2301 and second X-axis carriage assembly 2302, which can control the movement of first printhead device assembly 2501 and second printhead device assembly 2502, respectively across bridge 2130. For various embodiments of printing system 2000, first X-axis carriage assembly 2301 and second X-axis carriage assembly 2302 can utilize a linear air bearing motion system, which are intrinsically low-particle generating. According to various embodiments of a printing system of the present teachings, an X-axis carriage can have a Z-axis moving plate mounted thereupon. In FIG. 3, first X-axis carriage assembly 2301 is depicted with first Z-axis moving plate 2310, while second X-axis carriage assembly 2302 is depicted with second Z-axis moving plate 2312. Though FIG. 3 depicts two carriage assemblies and two printhead device assemblies, for various embodiments of printing system 2000, there can be a single carriage assembly and a single printhead device assembly. For example, either of first printhead device assembly 2501 and second printhead device assembly 2502 can be mounted on an X,Z-axis carriage assembly, while a camera system for inspecting features of substrate 2050 can be mounted on a second X,Z-axis carriage assembly. Various embodiments of printing system 2000 can have a single printhead device assembly, for example, either of first printhead device assembly 2501 and second printhead device assembly 2502 can be mounted on an X,Z-axis carriage assembly, while a UV lamp for curing an encapsulation layer printed on substrate 2050 can be mounted on a second X,Z-axis carriage assembly. For various embodiments of printing system 2000, there can be a single printhead device assembly, for example, either of first printhead device assembly 2501 and second printhead device assembly 2502, mounted on an X,Z-axis carriage assembly, while a heat source for curing an encapsulation layer printed on substrate 2050 can be mounted on a second carriage assembly.

In FIG. 3, each printhead device assembly, such as first printhead device assembly 2501 and second printhead device assembly 2502 of FIG. 3, can have a plurality of printheads mounted in at least one printhead device, as depicted in partial view for first printhead device assembly 2501, which depicts a plurality of printhead devices 2505. A printhead device can include, for example, but not limited by, fluidic and electronic connections to at least one printhead; each printhead having a plurality of nozzles or orifices capable of ejecting ink at a controlled rate, velocity and size. For various embodiments of printing system 2000, a printhead device assembly can include between about 1 to about 60 printhead devices, where each printhead device can have between about 1 to about 30 printheads in each printhead device. A printhead, for example, an industrial inkjet head, can have between about 16 to about 2048 nozzles, which can expel a droplet volume of between about 0.1 pL to about 200 pL.

According to various embodiments of a gas enclosure system of the present teachings, given the sheer number of printhead devices and printheads, first printhead management system 2701 and second printhead management system 2702 can be housed in an auxiliary enclosure, which can be isolated from a printing system enclosure during a printing process for performing various measurement and maintenance tasks with little or no interruption to the printing process. As can be seen in FIG. 3, first printhead device assembly 2501 can be seen positioned relative to first printhead management system 2701 for ready performance of various measurement and maintenance procedures that can be performed by first printhead management system apparatuses 2707, 2709 and 2711. Apparatuses 2707, 2709, and 2011 can be any of a variety of subsystems or modules for performing various printhead management functions. For example, apparatuses 2707, 2709, and 2011 can be any of a drop measurement module, a printhead replacement module, a purge basin module, and a blotter module. As depicted in FIG. 3, first printhead management system 2701 can have apparatuses 2707, 2709 and 2711, which can be mounted on linear rail motion system 2705 for positioning relative to first printhead device assembly 2501. Similarly, various apparatuses housed within second printhead management system 2702 can be mounted on linear rail motion system 2706 for positioning relative to first printhead device assembly 2502.

With respect to various embodiments of a gas enclosure assembly having an auxiliary enclosure that can be closed off from, as well as sealably isolated from a first working volume, for example, a printing system enclosure, reference is made again to FIG. 2. As depicted in FIG. 3, there can be four isolators on printing system 2000; first isolator set 2110 (second not shown on opposing side) and second isolator set 2112 (second not shown on opposing side), which support substrate floatation table 2200 of printing system 2000. For gas enclosure assembly 1000 of FIG. 2, first isolator set 2110 and second isolator set 2112 can be mounted in each of a respective isolator well panel, such as first isolator wall panel 1325 and second isolator wall panel 1327 of middle base panel assembly 1320. For gas enclosure assembly 1000 of FIG. 2, middle base assembly 1320 can include first printhead management system auxiliary enclosure 1330, as well as second printhead management system auxiliary panel assembly 1370. FIG. 2 of gas enclosure assembly 1000 depicts first printhead management system auxiliary enclosure 1330 that can include first back wall panel assembly 1338. Similarly, also depicted is second printhead management system auxiliary panel assembly 1370 that can include second back wall panel assembly 1378. First back wall panel assembly 1338 of first printhead management system auxiliary enclosure 1330 can be constructed in a similar fashion as shown for second back wall panel assembly 1378. Second back wall panel assembly 1378 of second printhead management system auxiliary panel assembly 1370 can be constructed from second back wall frame assembly 1378 having second seal-support panel 1375 sealably mounted to second back wall frame assembly 1378. Second seal-support panel 1375 can have second passage 1365, which is proximal to a second end of base 2100 (not shown). Second seal 1367 can be mounted on second seal-support panel 1375 around second passage 1365. A first seal can be similarly positioned and mounted around a first passage for first printhead management system auxiliary enclosure 1330. Each passage in auxiliary enclosure 1330 and auxiliary panel assembly 1370 can accommodate a printhead management system platform, such as first and second printhead management system platforms 2703 and 2704 of FIG. 3 pass through the passages.

According to the present teachings, in order to sealably isolate auxiliary enclosure 1330 and auxiliary panel assembly 1370 the passages, such as second passage 1365 of FIG. 2 must be sealable. It is contemplated that various seals, such as an inflatable seal, a bellows seal and a lip seal can be used for sealing a passage, such as second passage 1365 of FIG. 2, around a printhead management system platform affixed to a printing system base.

First printhead management system auxiliary enclosure 1330 and second printhead management system auxiliary panel assembly 1370 can include first printhead device assembly opening 1342 of first floor panel assembly 1341 and second printhead device assembly opening 1382 of second floor panel assembly 1381; respectively. First floor panel assembly 1341 is depicted in FIG. 2 as part of first middle enclosure panel assembly 1340 of middle panel assembly 1300. First floor panel assembly 1341 is a panel assembly in common with both first middle enclosure panel assembly 1340 and first printhead management system auxiliary enclosure 1330. Second floor panel assembly 1381 is depicted in FIG. 2 as part of second middle enclosure panel assembly 1380 of middle panel assembly 1300. Second floor panel assembly 1381 is a panel assembly in common with both second middle enclosure panel assembly 1380 and second printhead management system auxiliary panel assembly 1370.

As previously discussed herein, first printhead device assembly 2501 can be housed in first printhead device assembly enclosure 2503, and second printhead device assembly 2502 can be housed in second printhead device assembly enclosure 2504. According to systems and methods of the present teachings, first printhead device assembly enclosure 2503 and second printhead device assembly enclosure 2504 can have an opening at the bottom that can have a rim (not shown), so that various printhead devices; each printhead device having at least one printhead, can be positioned for printing during a printing process. Additionally, the portions of first printhead device assembly enclosure 2503 and second printhead device assembly enclosure 2504 forming a housing can be constructed as described herein for various panel assemblies, so that the frame assembly members and panels are capable of providing an hermetically-sealed enclosure.

A compressible gasket which can additionally be used for the hermetic sealing of various frame members, can be affixed around each of first printhead device assembly opening 1342 and second printhead device assembly opening 1382, or alternatively around the rim of first printhead device assembly enclosure 2503 and second printhead device assembly enclosure 2504.

According to the present teachings, compressible gasket material can be selected from, for example, but not limited by, any in the class of closed-cell polymeric materials, also referred to in the art as expanded rubber materials or expanded polymer materials. Briefly, a closed-cell polymer is prepared in a fashion whereby gas is enclosed in discrete cells; where each discrete cell is enclosed by the polymeric material. Properties of compressible closed-cell polymeric gasket materials that are desirable for use in gas-tight sealing of frame and panel components include, but are not limited by, that they are robust to chemical attack over a wide range of chemical species, possess excellent moisture-barrier properties, are resilient over a broad temperature range, and they are resistant to a permanent compression set. In general, compared to open-cell-structured polymeric materials, closed-cell polymeric materials have higher dimensional stability, lower moisture absorption coefficients, and higher strength. Various types of polymeric materials from which closed-cell polymeric materials can be made include, for example, but not limited by, silicone, neoprene, ethylene-propylene-diene terpolymer (EPT); polymers and composites made using ethylene-propylene-diene-monomer (EPDM), vinyl nitrile, styrene-butadiene rubber (SBR), and various copolymers and blends thereof.

In addition to close-cell compressible gasket materials, another example of a class of compressible gasket material having desired attributes for use in constructing embodiments of a gas enclosure assembly according to the present teachings includes the class of hollow-extruded compressible gasket materials. Hollow-extruded gasket materials as a class of materials have the desirable attributes, including, but not limited by, that they are robust to chemical attack over a wide range of chemical species, possess excellent moisture-barrier properties, are resilient over a broad temperature range, and they are resistant to a permanent compression set. Such hollow-extruded compressible gasket materials can come in a wide variety of form factors, such as for example, but not limited by, U-cell, D-cell, square-cell, rectangular-cell, as well as any of a variety of custom form factor hollow-extruded gasket materials. Various hollow-extruded gasket materials can be fabricated from polymeric materials that are used for closed-cell compressible gasket fabrication. For example, but not limited by, various embodiments of hollow-extruded gaskets can be fabricated from silicone, neoprene, ethylene-propylene-diene terpolymer (EPT); polymers and composites made using ethylene-propylene-diene-monomer (EPDM), vinyl nitrile, styrene-butadiene rubber (SBR), and various copolymers and blends thereof. Compression of such hollow cell gasket materials should not exceed about 50% deflection in order to maintain the desired attributes. It is contemplated that various types of inflatable seals can be utilized for sealing a printhead device assembly using first printhead device assembly docking gasket 1345 and second printhead device assembly docking gasket 1385. Such inflatable seals may provide rapid sealing and unsealing during processing, as well as being fabricated from low-contamination materials, such as low particle generating, low outgassing polymeric materials, such as silicones, neoprenes and butyl rubber materials.

As depicted in FIG. 2, first printhead device assembly docking gasket 1345 and second printhead device assembly docking gasket 1385 can be affixed around first printhead device assembly opening 1342 and second printhead device assembly opening 1382, respectively. During various printhead measurement and maintenance procedures, first printhead device assembly 2501 and second printhead device assembly 2502 can be positioned by first X,Z-axis carriage assembly 2301 and second X,Z-axis carriage assembly 2302, respectively, over first printhead device assembly opening 1342 of first floor panel assembly 1341 and second printhead device assembly opening 1382 of second floor panel assembly 1381, respectively. In that regard, for various printhead measurement and maintenance procedures, first printhead device assembly 2501 and second printhead device assembly 2502 can be positioned over first printhead device assembly opening 1342 of first floor panel assembly 1341 and second printhead device assembly opening 1382 of second floor panel assembly 1381, respectively, without covering or sealing first printhead device assembly opening 1342 and second printhead device assembly opening 1382. First X,Z-axis carriage assembly 2301 and second X,Z-axis carriage assembly 2302 can dock first printhead device assembly enclosure 2503 and second printhead device assembly enclosure 2504, respectively, with first printhead management system auxiliary enclosure 1330 and second printhead management system auxiliary panel assembly 1370, respectively. In various printhead measurement and maintenance procedures, such docking may effectively close first printhead device assembly opening 1342 and second printhead device assembly opening 1382 without the need for sealing first printhead device assembly opening 1342 and second printhead device assembly opening 1382. For various printhead measurement and maintenance procedures, the docking can include the formation of a gasket seal between each of the printhead device assembly enclosures and the printhead management system panel assemblies. In conjunction with sealably closing passages, such as second passage 1365 and a complementary first passage of FIG. 2, when first printhead device assembly enclosure 2503 and second printhead device assembly enclosure 2504 are docked with first printhead management system auxiliary enclosure 1330 and second printhead management system auxiliary panel assembly 1370 to sealably close first printhead device assembly opening 1342 and second printhead device assembly opening 1382, the combined structures so formed are hermetically sealed.

Additionally, according to the present teachings, an auxiliary enclosure can be isolated from, for example, another interior enclosure volume, such as the printing system enclosure, as well as the exterior of a gas enclosure assembly, by using a structural closure to sealably close a passageway, such as first printhead device assembly opening 1342 and second printhead device assembly opening 1382 of FIG. 2. According to the present teachings, a structural closure can include a variety of sealable coverings for an opening or passageway; such opening or passageway including non-limiting examples of an enclosure panel opening or passageway. According to systems and methods of the present teachings, a gate can be any structural closure that can be used to reversibly cover or reversibly sealably close any opening or passageway using pneumatic, hydraulic, electrical, or manual actuation. As such, first printhead device assembly opening 1342 and second printhead device assembly opening 1382 of FIG. 2 can be reversibly covered or reversibly sealably closed using a gate.

In the expanded view of printing system 2000 of FIG. 3, various embodiments of a printing system can include substrate floatation table 2200, supported by substrate floatation table base 2220. Substrate floatation table base 2220 can be mounted on printing system base 2100. Substrate floatation table 2200 of printing system can support substrate 2050, as well as defining the travel over which substrate 2050 can be moved through gas enclosure assembly 1000 during the printing of a substrate. A Y-axis motion system of the present teachings can include first Y-axis support beam 2351 and second Y-axis support beam 2352, which can include a gripper system (not shown) for holding a substrate, which will be discussed in more detail herein. Y-axis motion can be provided by either a linear air bearing or linear mechanical system. In that regard, in conjunction with a motion system; as depicted in FIG. 3, a Y-axis motion system, substrate floatation table 2200 can provide frictionless conveyance of substrate 2050 through a printing system.

Figure 4:
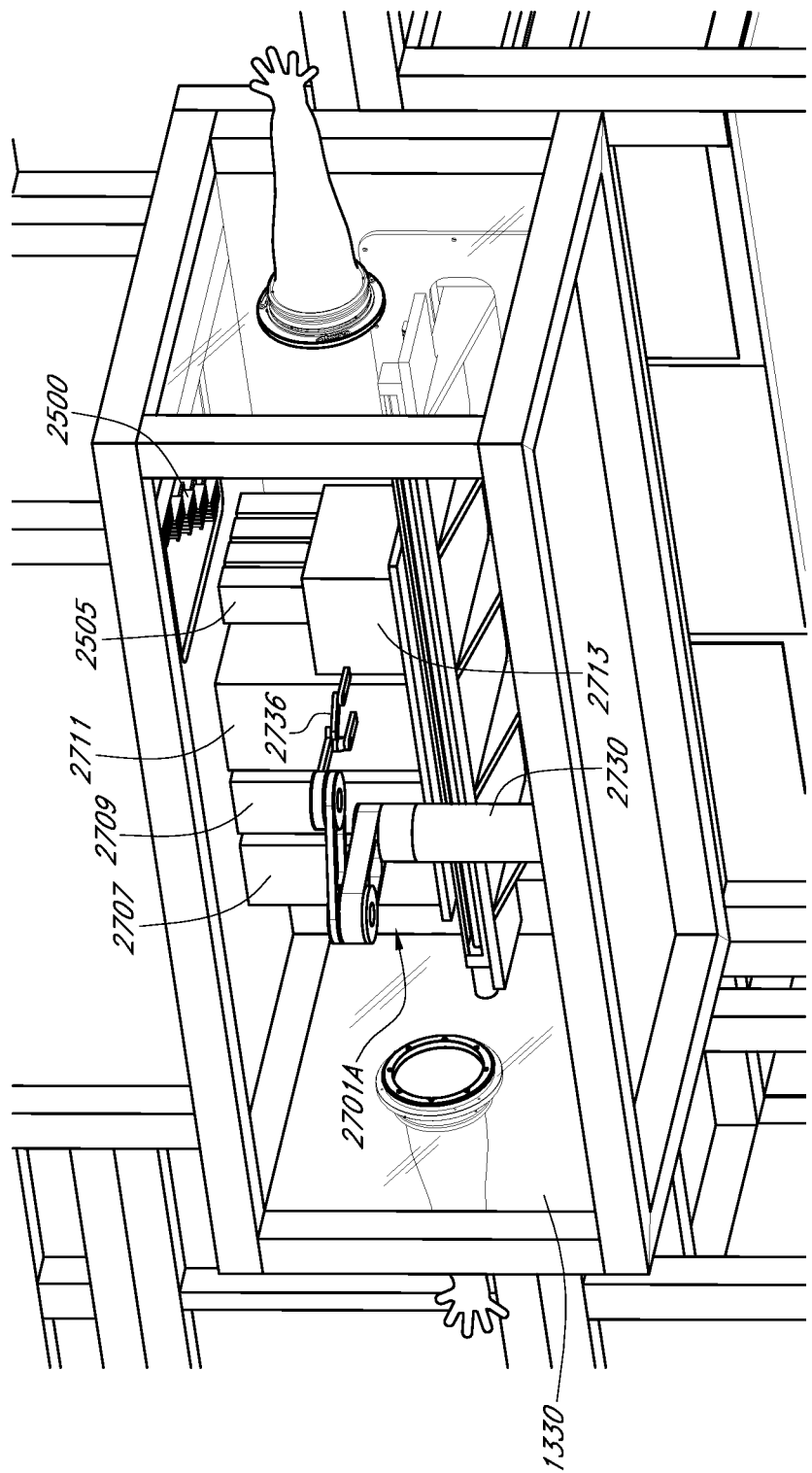
FIG. 4 is an expanded perspective view that illustrates generally an auxiliary enclosure of a gas enclosure system according to various embodiments of the present teachings.

FIG. 4 depicts an expanded view of first printhead management system 2701 housed within first printhead management system auxiliary enclosure 1330 in accordance with various embodiments of a gas enclosure assembly and system of the present teachings. As depicted in FIG. 4, auxiliary enclosure 1330 is shown as a cut-away view to more clearly see the details of first printhead management system 2701. Various embodiments of a printhead management system according to the present teachings, such as first printhead management system 2701 of FIG. 4, apparatuses 2707, 2709, and 2011 can be a variety of subsystems or modules for performing various functions. For example, apparatuses 2707, 2709, and 2011 can be a drop measurement module, a printhead purge basin module and a blotter module. As depicted in FIG. 4, printhead replacement module 2713 can provide locations for docking at least one printhead device 2505. In various embodiments of first printhead management system 2701, first printhead management system auxiliary enclosure 1330 can be maintained to the same environmental specifications that gas enclosure assembly 1000 (see FIG. 1) is maintained. First printhead management system auxiliary enclosure 1330 can have handler 2730 positioned for the carrying out tasks associated with various printhead management procedures. For example, each subsystem can have various parts that are consumable by nature, and require replacement, such as replacing blotter paper, ink, and waste reservoirs. Various consumable parts can be packaged for ready insertion, for example, in a fully automated mode using a handler. As a non-limiting example, blotter paper can be packaged in a cartridge format, which can be readily inserted for use into a blotting module. By way of another non-limiting example ink can be packaged in a replaceable reservoir, as well as a cartridge format for use in a printing system. Various embodiments of a waste reservoir can be packaged in a cartridge format, which can be readily inserted for use into a purge basin module. Additionally, parts of various components of a printing system subject to on-going use can require periodic replacement. During a printing process, expedient management of a printhead device assembly, for example, but not limited by, an exchange of a printhead device or printhead, can be desirable. A printhead replacement module can have parts, such as a printhead device or printhead, which can be readily inserted for use into a printhead device assembly. A drop measurement module used for checking for nozzle firing, as well as the measurement based on optical detection of drop volume, velocity and trajectory from every nozzle can have a source and a detector, which can require periodic replacement after use. Various consumable and high-usage parts can be packaged for ready insertion, for example, in a fully automated mode using a handler. Handler 2730 can have end effector 2736 mounted to arm 2534. Various embodiments of an end effector configuration can be used, for example, a blade-type end effector, a clamp-type end effector, and a gripper-type end effector. Various embodiments of an end effector can include mechanical grasping and clamping, as well as pneumatic or vacuum-assisted assemblies to either actuate portions of the end effector or otherwise retain a printhead device or a printhead from a printhead device.

Regarding the replacement of a printhead device or printhead, printhead replacement module 2713 of printhead management system 2701 FIG. 4 can include a docking station for a printhead device having at least one printhead, as well as a storage receptacle for a printhead. As each printhead device assembly (see FIG. 2) can include between about 1 to about 60 printhead devices, and as each printhead device can have between about 1 to about 30 printheads, then various embodiments of a printing system of the present teachings can have between about 1 to about 1800 printheads. In various embodiments of printhead replacement module 2713, while a printhead device is docked, each printhead mounted to the printhead device can be maintained in an operable condition while not in use in a printing system. For example, when placed in a docking station, each printhead on each printhead device can be connected to an ink supply and an electrical connection. Electrical power can be provided to each printhead on each printhead device, so that a periodic firing pulse to each nozzle of each printhead can be applied while docked in order to ensure that the nozzles remain primed and do not clog. Handler 2730 of FIG. 4 can be positioned proximal to printhead device assembly 2500. Printhead device assembly 2500 can be docked over first printhead management system auxiliary enclosure 1330, as depicted in FIG. 4. During a procedure for exchanging a printhead, handler 2730 can remove a target part; either a printhead or printhead device having at least one printhead, from printhead device assembly 2500. Handler 2730 can retrieve a replacement part, such as a printhead device or a printhead, from printhead replacement module 2713, and complete the replacement process. The removed part can be placed in printhead replacement module 2713 for retrieval.

Figure 5B:
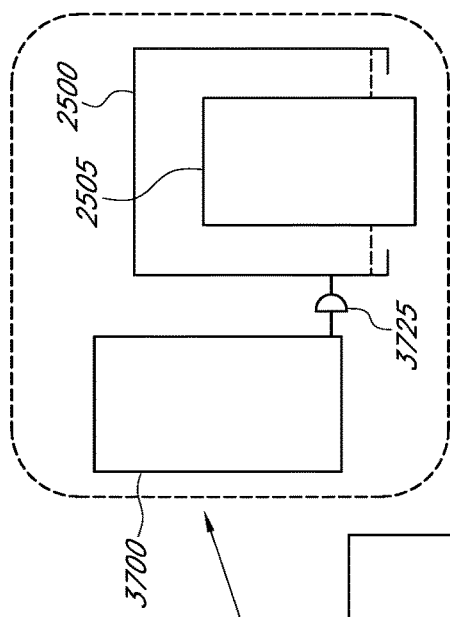
FIG. 5B is an expanded view of a local ink delivery system of FIG. 5A in flow communication with a printhead device assembly.
Figure 5C:
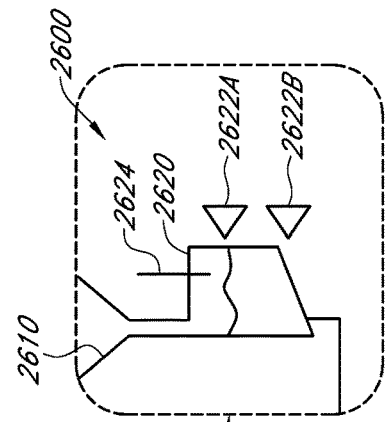
FIG. 5C is an expanded view of a local waste assembly in flow communication with a bulk ink delivery system.
Figure 5A:
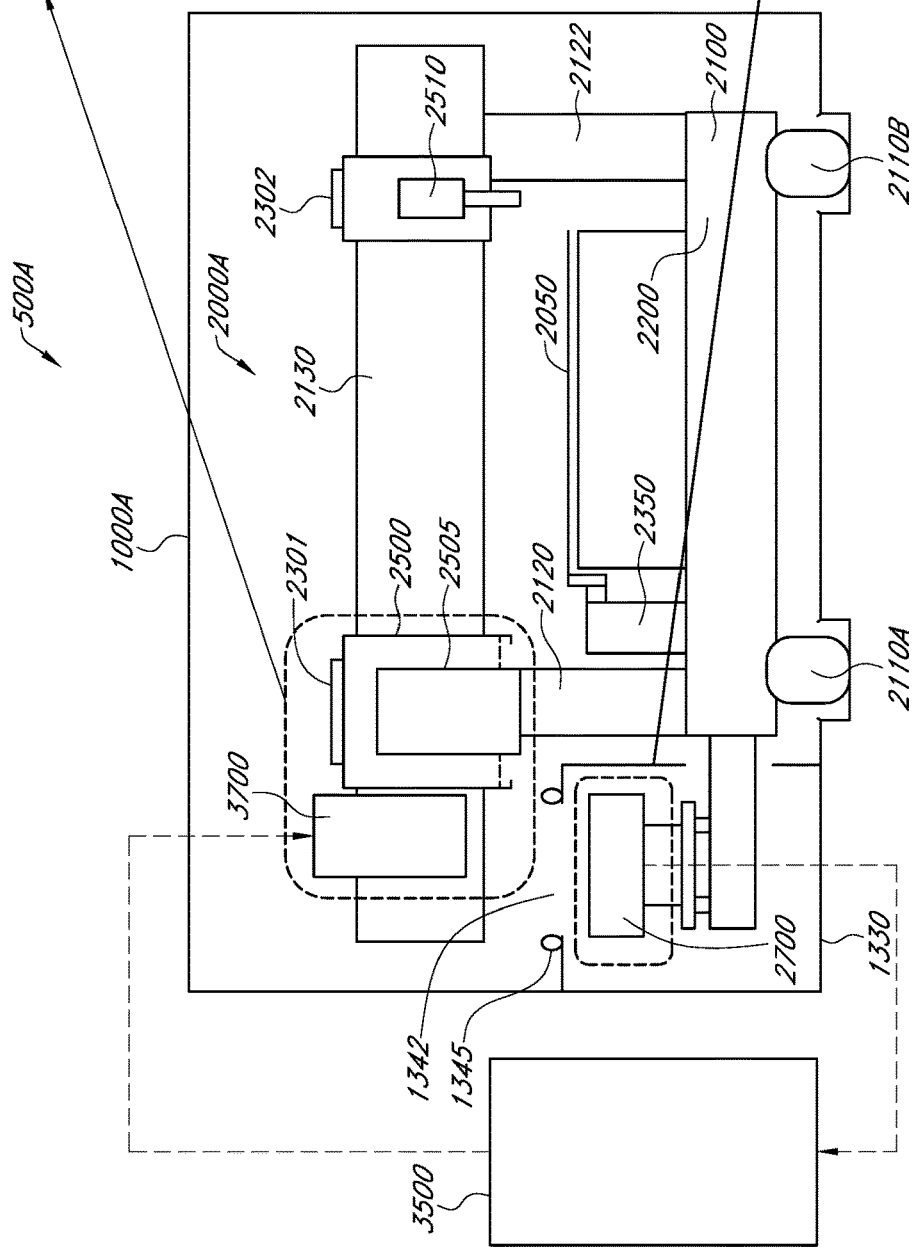
FIG. 5A is a schematic representation of a local ink delivery system and a local waste assembly in flow communication with a bulk ink delivery system that illustrates generally various embodiments an enclosed printing system of the present teachings.

As depicted in FIG. 5A, gas enclosure 1000A can house printing system 2000A. As will be discussed in more detail subsequently herein, enclosed printing system 500A can have features as described for various embodiments of enclosed printing system 500C of FIG. 11, while printing system 2000A can have all the features described for printing system 2000 of FIG. 3. Printing system 2000A can have printing system base 2100, which can be supported by at least two sets of isolators such as isolator set 2110 that includes isolators 2110A and 2110B of FIG. 5A. Y-axis motion system 2350 can be mounted on printing system base 2100. Substrate 2050 can be floatingly supported by substrate floatation table 2200. Printing system base 2100 can support first riser 2120 and second riser 2122, upon which bridge 2130 can be mounted. Printing system bridge 2130 can support first X-axis carriage assembly 2301, upon which printhead device assembly 2500 can be mounted, and second X-axis carriage assembly 2302, upon which camera assembly 2510 can be mounted.

Camera assembly 2510 of FIG. 5A can be utilized, for example, but not limited by, navigation, as well as inspection. Various embodiments of a printing system camera assembly can have different specifications regarding field of view and resolution. For example, one camera can be a line scan camera for in situ particle inspection, while a second camera can be used for the regular navigation of a substrate in a gas enclosure system, or for the location of a printhead device assembly relative to a substrate. Such a camera useful for regular navigation can be an area scan camera having a field of view in the range of about 5.4 mm×4 mm with a magnification of about 0.9× to about 10.6 mm×8 mm with a magnification of about 0.45×. In still other embodiments, one camera can be a line scan camera for in situ particle inspection, while a second camera can be used for the precise navigation of a substrate in a gas enclosure system, for example, for substrate alignment, or for the precise location of a printhead device assembly relative to a substrate. Such a camera can be useful for precise navigation can be an area scan camera having a field of view of about 0.7 mm×0.5 mm with a magnification of about 7.2×.

Additionally, gas enclosure 1000A can have auxiliary enclosure 1330, which can enclose printhead management system 2700. Printhead management system 2700 can include a local waste assembly that can be in flow communication with a bulk waste assembly that can be housed within bulk ink delivery system 3500. Auxiliary enclosure 1330 can be in flow communication with the remaining working volume of gas enclosure 1000A through printhead device assembly opening 1342. As previously discussed herein, printhead device assembly docking gasket 1345 can provide a gasket seal that can isolate auxiliary enclosure when printhead device assembly 2500 is sealably docked on printhead device assembly docking gasket 1345.

As depicted in FIG. 5A, various embodiments of bulk ink delivery system 3500 can be externally located to gas enclosure 1000A and in flow communication with various embodiments of local ink delivery system 3700, as indicated by the hatched input line of FIG. 5A. Local ink delivery system 3700 can be mounted proximal printhead device assembly 2500 on first X-axis carriage assembly 2301, and in flow communication with printhead device assembly 2500. Additionally, a local waste assembly, which can be a component of printhead management system 2700, can be in flow communication with a bulk waste assembly externally located to gas enclosure 1000A, as indicated by the hatched output line of FIG. 5A. As indicated in FIG. 5B, local ink delivery system 3700 can be in flow communication with printhead device assembly 2500 through a local ink dispensing reservoir output line, which can be coupled to a printhead device assembly input line through compression fitting 3725. As indicated in FIG. 5C, printhead management system 2700 can have local waste reservoir assembly 2600, which can be part of a purge basin module of printhead management system 2700, as previously discussed herein. Local waste reservoir assembly 2600 can include waste liquid inlet receptacle 2610, depicted in FIG. 5C being funnel-shaped. Waste liquid inlet receptacle 2610 can be any receptacle capable of collecting liquid from a printhead device assembly waste line, while preventing liquid loss thereby. Local waste reservoir assembly 2600 can include local waste reservoir 2620, which can have first liquid level indicator 2622A, for monitoring a high waste liquid level, and second liquid level indicator 2622B, for monitoring a low waste liquid level. Local waste reservoir 2620 can have vent 2624, and as previously discussed herein, local waste reservoir 2620 can be in flow communication with a bulk waste assembly housed in bulk ink delivery system 3500.

Figure 5D:
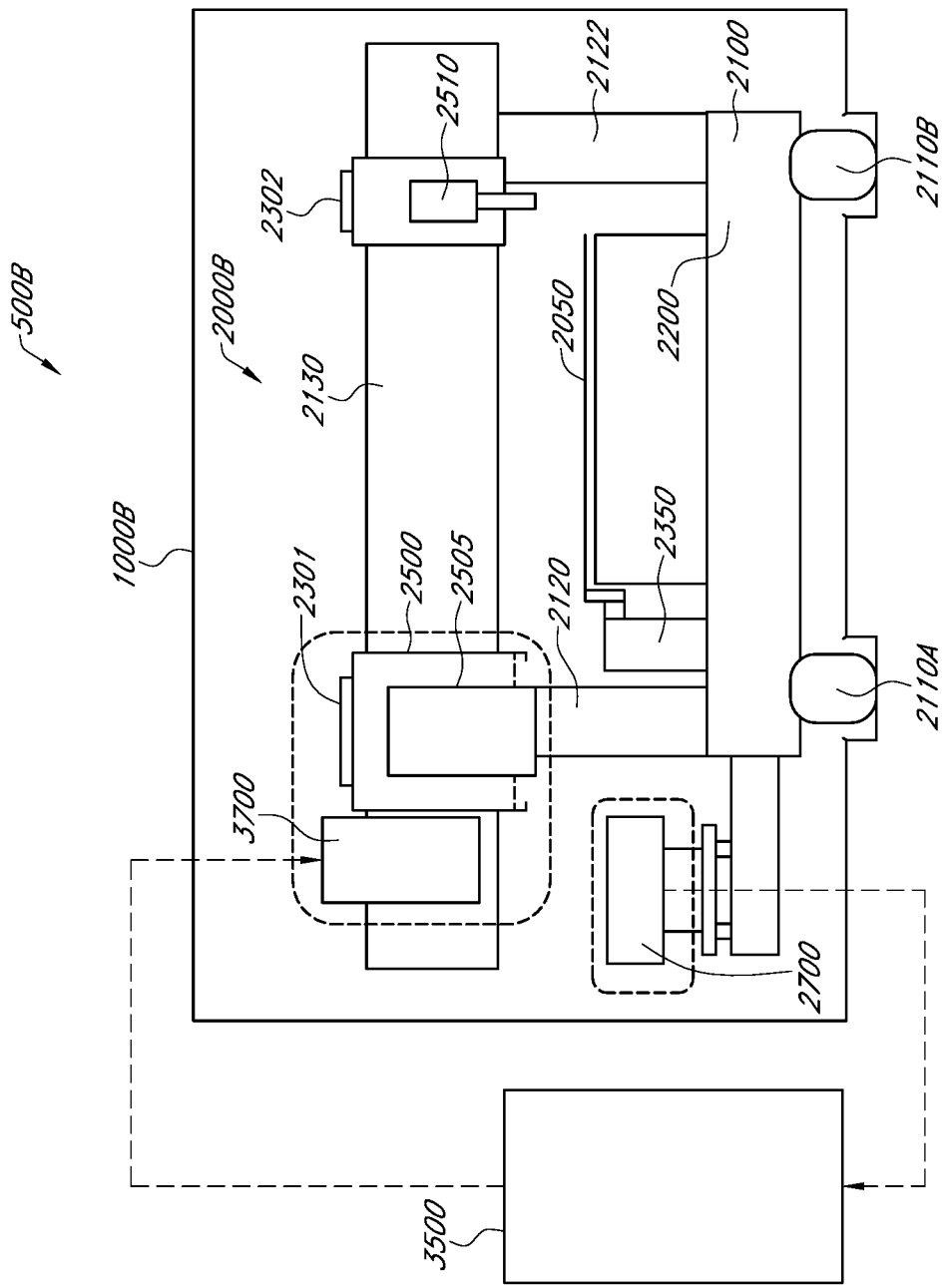
FIG. 5D is a schematic representation of a local ink delivery system and a local waste assembly in flow communication with a bulk ink delivery system that illustrates generally various embodiments an enclosed printing system of the present teachings.

Enclosed printing system 500B of FIG. 5D can have the many of the features as described herein for enclosed printing system 500A of FIG. 5A. As depicted in FIG. 5D, gas enclosure 1000B can house printing system 2000B. As will be discussed in more detail subsequently herein, enclosed printing system 500B of FIG. 5D can have features as described for various embodiments of enclosed printing system 500C of FIG. 11, while printing system 2000B can have all the features described for printing system 2000 of FIG. 3, as well as printing system 2000A of FIG. 5A. Printing system 2000B of FIG. 5D can have printing system base 2100, which can be supported by at least two sets of isolators such as isolator set 2110 that includes isolators 2110A and 2110B. Y-axis motion system 2350 can be mounted on printing system base 2100. Substrate 2050 can be floatingly supported by substrate floatation table 2200. Printing system base 2100 can support first riser 2120 and second riser 2122, upon which bridge 2130 can be mounted. Printing system bridge 2130 can support first X-axis carriage assembly 2301, upon which printhead device assembly 2500 can be mounted, and second X-axis carriage assembly 2302, upon which camera assembly 2510 can be mounted. Recalling, various embodiments of enclosed printing system 500A of FIG. 5A can include a contoured enclosure, such as depicted with gas enclosure 1000 of FIG. 1, which can have auxiliary enclosure 1330. Various embodiments of gas enclosure 1000B of FIG. 5D can be a contoured enclosure according to various embodiments of a gas enclosure without an auxiliary enclosure, as will be described in more detail herein for FIG. 10A.

As depicted in FIG. 5D, various embodiments of bulk ink delivery system 3500 can be externally located to gas enclosure 1000B and in flow communication with various embodiments of local ink delivery system 3700, as indicated by the hatched input line of FIG. 5D. Local ink delivery system 3700 can be mounted proximal printhead device assembly 2500 on first X-axis carriage assembly 2301, and in flow communication with printhead device assembly 2500. Additionally, a local waste assembly, which can be a component of printhead management system 2700, can be in flow communication with a bulk waste assembly externally located to gas enclosure 1000B, as indicated by the hatched output line of FIG. 5D.

Figure 6A:
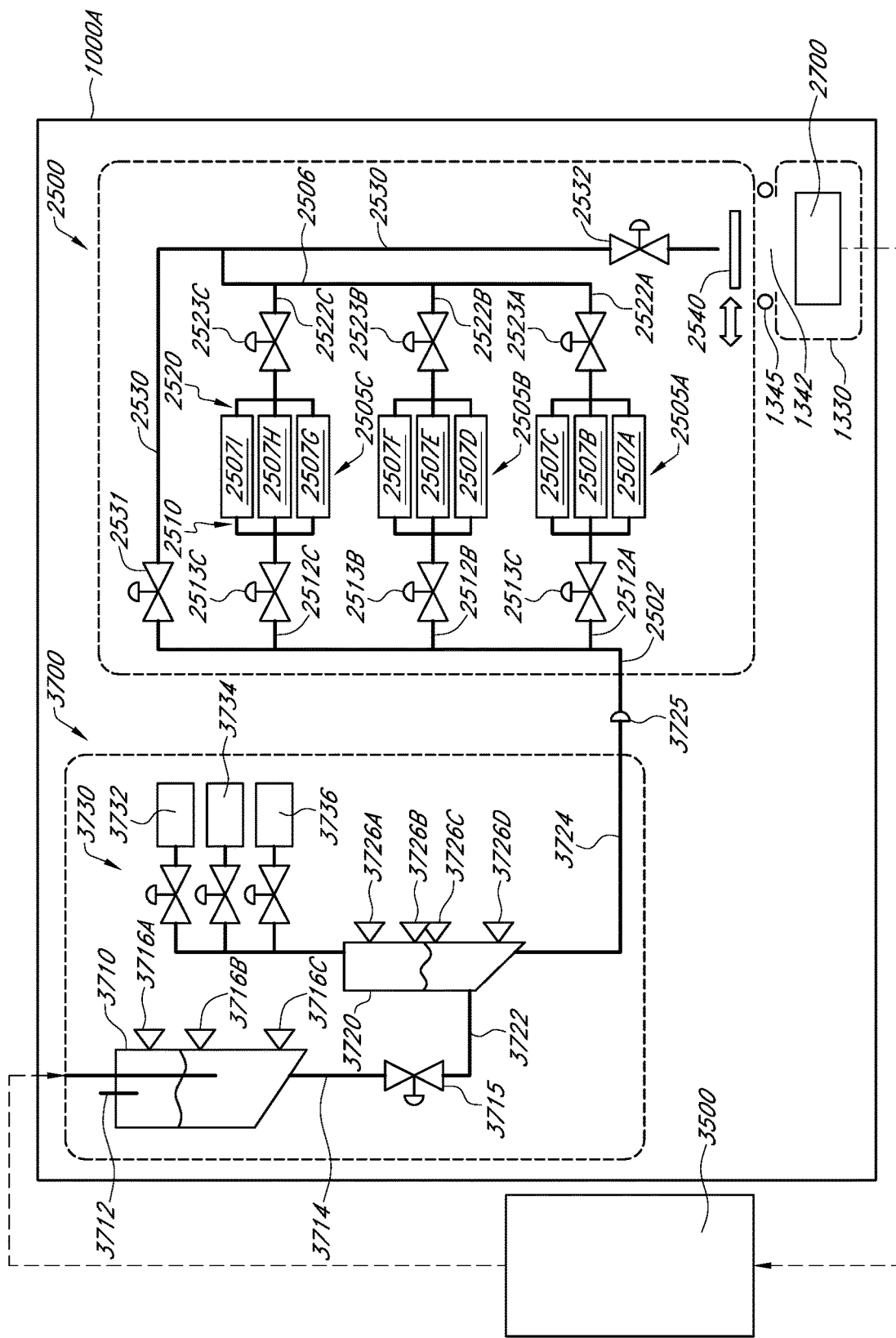
FIG. 6A and FIG. 6B are schematic representations of various components of an ink delivery system for an enclosed printing system that illustrate generally various embodiments of the present teachings.
Figure 6B:
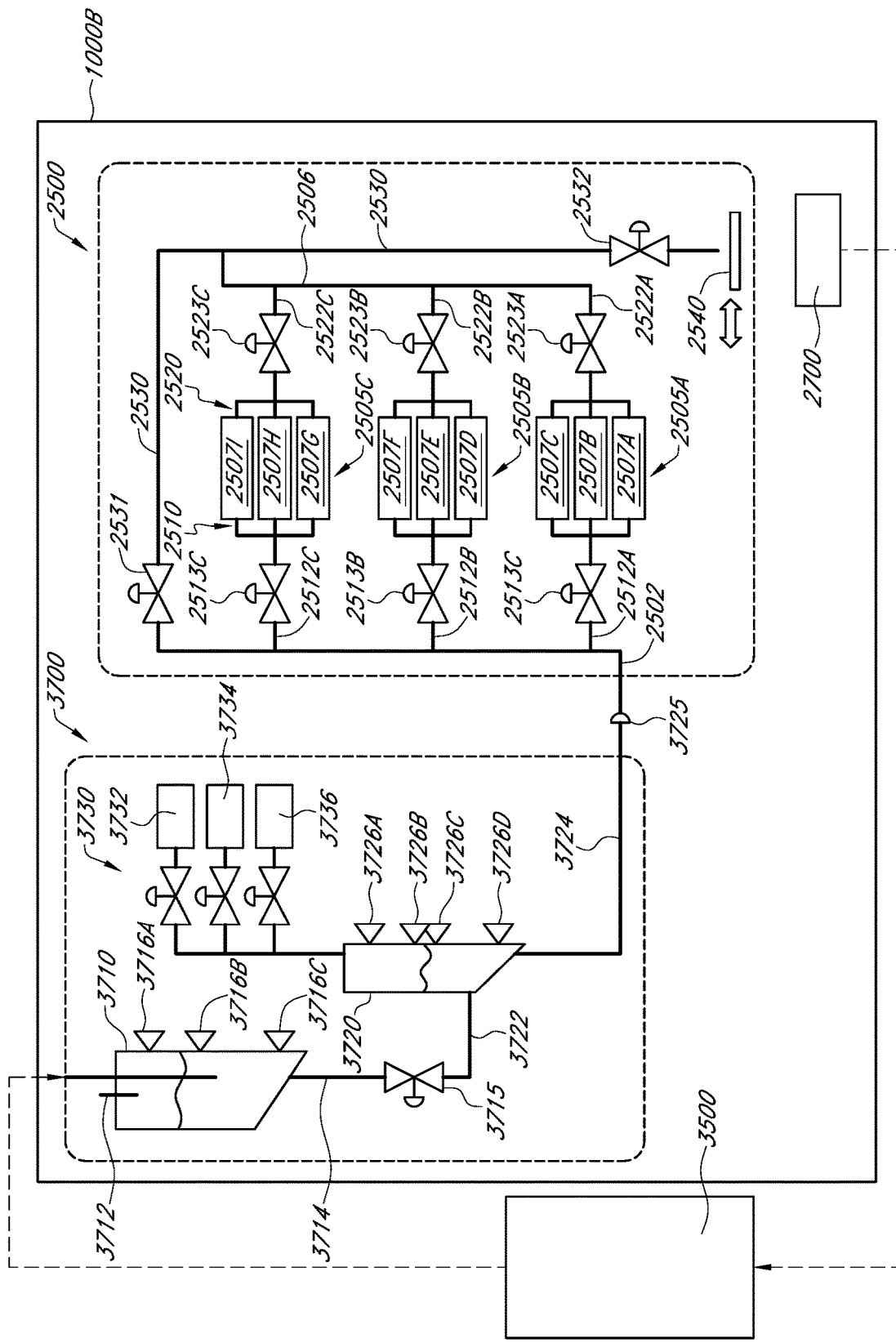

FIG. 6A and FIG. 6B are schematic views of a printing system ink delivery system that can be housed in gas enclosure 1000A and 1000B, respectively. Various embodiments of gas enclosure 1000A can be a contoured enclosure, such as depicted with gas enclosure 1000 of FIG. 1, which can have auxiliary enclosure 1330. Various embodiments of gas enclosure 1000B of FIG. 6B can be a contoured enclosure according to various embodiments of a gas enclosure without an auxiliary enclosure, as will be described in more detail herein for FIG. 10A. The printing system ink delivery system for FIG. 6A and FIG. 6B can include local ink delivery system 3700, which in in flow communication with bulk ink delivery system 3500, as indicated by the as indicated by the hatched input line of FIG. 6A and FIG. 6B. Local ink delivery system 3700 can be in flow communication with printhead device assembly 2500, thereby providing a supply of ink to one or more printhead device, each printhead device including one or more printhead device assembly. Various embodiments local ink delivery system 3700 of the present teachings can include local ink replenishment reservoir 3710, local ink dispensing reservoir 3720, and pneumatic control manifold 3730.

Local ink replenishment reservoir 3710, which can include local ink replenishment reservoir vent 3712, can receive a supply of ink from bulk ink delivery system 3500 from a bulk ink delivery system inlet line, as indicated by the hatched input line. Local ink delivery system 3700 can include at least three liquid level indicators associated with local ink replenishment reservoir 3710; an upper-level liquid indicator 3716A, mid-level liquid indicator 3716B, and lower-level liquid indicator 3716C. The liquid level indicators 3716A, 3716AB and 3716AC for local ink replenishment reservoir 3710 can be part of a dynamic liquid level control system that can ensure that a sufficient level of an ink is supplied from bulk ink delivery system 3500 to local ink replenishment reservoir 3710. As depicted in FIG. 6A and FIG. 6B, for various embodiment of a printing system, a sufficient amount of ink in local ink replenishment reservoir 3710 can be defined by liquid level indicator 3716A, so that an ink level will not exceed liquid level indicator 3716A within the tolerance of the liquid level control system to maintain that level. As depicted in FIG. 6A and FIG. 6B, for various embodiment of a printing system, a sufficient amount of ink in local ink replenishment reservoir 3710 can be defined by liquid level indicator 3716B, so that an ink level will be essentially at the level of liquid level indicator 3716B within the tolerance of the liquid level control system to maintain that level. As depicted in FIG. 6A and FIG. 6B, for various embodiment of a printing system, a sufficient amount of ink in local ink replenishment reservoir 3710 can be defined by liquid level indicator 3716C, so that an ink level will not go below liquid level indicator 3716C within the tolerance of the liquid level control system to maintain that level. According to the present teachings, various embodiments of upper-level liquid indicator 3716A, mid-level liquid indicator 3716B, and lower-level liquid indicator 3716C can control the level of an ink at their respective positions on local ink replenishment reservoir 3710 to a tolerance of +/−200 microns. According to the present teachings, various embodiments of upper-level liquid indicator 3716A, mid-level liquid indicator 3716B, and lower-level liquid indicator 3716C can control the level of an ink at their respective positions on local ink replenishment reservoir 3710 to a tolerance of +/−500 microns. Local ink replenishment reservoir 3710 can be in flow communication with local ink replenishment reservoir outlet line 3714, which can be in flow communication with local ink dispensing reservoir 3720 via local ink dispensing reservoir inlet line 3722. As depicted in FIG. 6A and FIG. 6B, flow communication between local ink replenishment reservoir outlet line 3714 and local ink dispensing reservoir inlet line 3722 can be controlled using local ink delivery system control valve 3715.

Local ink delivery system 3700 can include at least four liquid level indicators associated with local ink dispensing reservoir 3720; upper-level liquid indicator 3726A, first mid-level liquid indicator 3726B, second mid-level liquid indicator 3726C, and lower-level liquid indicator 3726D. As previously discussed herein for local ink replenishment reservoir 3710, the liquid level indicators associated with local ink dispensing reservoir 3720 can be part of a dynamic liquid level control system that can ensure that a sufficient level of an ink is supplied from local ink replenishment reservoir 3710 to local ink dispensing reservoir 3720. In the case of the liquid level in local ink dispensing reservoir 3720, in order for the static head pressure to be constant above a printhead device assembly, the liquid level in local ink dispensing reservoir 3720 can be keep constant within a desired tolerance using first mid-level liquid indicator 3726B and second mid-level liquid indicator 3726C. Additionally, as depicted in FIG. 6A and FIG. 6B, for various embodiment of a printing system, a sufficient amount of ink in local ink dispensing reservoir 3720 can be defined by liquid level indicator 3726A, so that an ink level will not exceed liquid level indicator 3726A within the tolerance of the liquid level control system to maintain that level. Similarly, as depicted in FIG. 6A and FIG. 6B, for various embodiment of a printing system, a sufficient amount of ink in local ink dispensing reservoir 3720 can be defined by liquid level indicator 3726D, so that an ink level will not go below liquid level indicator 3726D within the tolerance of the liquid level control system to maintain that level. According to the present teachings, various embodiments of upper-level liquid indicator 3726A, first mid-level liquid indicator 3726B, second mid-level liquid indicator 3726C, and lower-level liquid indicator 3726D can control the level of an ink at their respective positions on local ink dispensing reservoir 3720 to a tolerance of +/−200 microns. According to the present teachings, various embodiments of upper-level liquid indicator 3726A, first mid-level liquid indicator 3726B, second mid-level liquid indicator 3726C, and lower-level liquid indicator 3726D can control the level of an ink at their respective positions on local ink dispensing reservoir 3720 to a tolerance of +/−500 microns. Pneumatic control assembly 3730 can provide control between local ink dispensing reservoir 3720 and various pneumatic control sources, such as gas 3732, such as nitrogen, regulated 3434 vacuum source and vent 3436.

Local ink dispensing reservoir outlet line 3724 can be in flow communication with printhead device assembly inlet line 2502; thereby providing flow communication between local ink dispensing reservoir 3720 and printhead device assembly 2500. Local ink dispensing reservoir outlet line 3724 can be coupled to printhead device assembly inlet line 2502 using compression fitting 3725. As depicted in FIG. 6A and FIG. 6B, local ink dispensing reservoir 3720 can be in flow communication with printhead device assembly inlet line 2502. Printhead device assembly inlet line 2502 can be in flow communication with a plurality of printheads devices; printhead device 2505A, printhead device 2505B, and printhead device 2505C, through printhead device assembly supply manifold 2510. Each printhead device can have a plurality of printheads per device. As depicted schematically in FIG. 6A and FIG. 6B, printhead device 2505A has printheads 2507A, 2507B and 2507C, while printhead device 2505B has printheads 2507D, 2507E and 2507F, and printhead device 2505C has printheads 2507G, 2507H and 2507I. Printhead device assembly supply manifold 2510 can have supply manifold inlet line 2512A, supply manifold inlet line 2512B, and supply manifold inlet line 2512C, in flow communication with printhead device 2505A, printhead device 2505B, and printhead device 2505C, respectively. Flow communication between printhead device assembly inlet line 2502 and supply manifold inlet line 2512A, supply manifold inlet line 2512B, and supply manifold inlet line 2512C can be controlled by supply manifold inlet control valve 2513A, supply manifold inlet control valve 2513B, and supply manifold inlet control valve 2513C, respectively. Flow spitting into three equal flow paths can be done for each of supply manifold inlet line 2512A, supply manifold inlet line 2512B, and supply manifold inlet line 2512C, as schematically depicted in FIG. 6A and FIG. 6B, so that each of three printheads for each printhead device receives equal flow of ink.

Printhead device 2505A, printhead device 2505B, and printhead device 2505C, can be in flow communication with printhead device assembly return manifold 2520. Printhead device assembly return manifold 2520 can be in flow communication with return manifold outlet line 2522A, return manifold outlet line 2522B, and return manifold outlet line 2522C. Return manifold outlet line 2522A, return manifold outlet line 2522B, and return manifold outlet line 2522C can be in flow communication with printhead device assembly outlet line 2506. Flow communication between printhead device assembly return manifold 2520 and printhead device assembly outlet line 2506 can be controlled by return manifold outlet control valve 2523A, return manifold outlet control valve 2523B, and return manifold outlet control valve 2523C, which are associated with return manifold outlet line 2522A, return manifold outlet line 2522B, and return manifold outlet line 2522C respectively. Both printhead device assembly inlet line 2502 and printhead device assembly outlet line 2506 can be in flow communication with printhead device assembly output waste line 2530. Flow communication between printhead device assembly inlet line 2502 and printhead device assembly output waste line 2530 can be controlled using printhead device assembly waste line first control valve 2531. Printhead device assembly waste line second control valve 2532 can control the flow communication between printhead device assembly 2500 and a local waste assembly. Printhead device assembly output waste line 2530 can be in flow communication with local ink waste assembly 2600 (see for example FIG. 5A), which is part of printhead management system 2700 that can be housed within auxiliary enclosure 1330 of FIG. 6A or gas enclosure 1000B of FIG. 6B.

With respect to FIG. 6A, as previously discussed herein, auxiliary enclosure 1330 can be in flow communication with the remaining working volume of gas enclosure 1000A through printhead device assembly opening 1342. Further, printhead device assembly docking gasket 1345 can provide a gasket seal that can isolate auxiliary enclosure when printhead device assembly 2500 is sealably docked on printhead device assembly docking gasket 1345. Local ink waste assembly 2600 in turn is in flow communication with a bulk ink delivery system waste assembly, as indicated by the hatched output line of FIG. 6A. A bulk ink delivery system waste assembly can be housed within bulk ink delivery system 3500.

Figure 7:
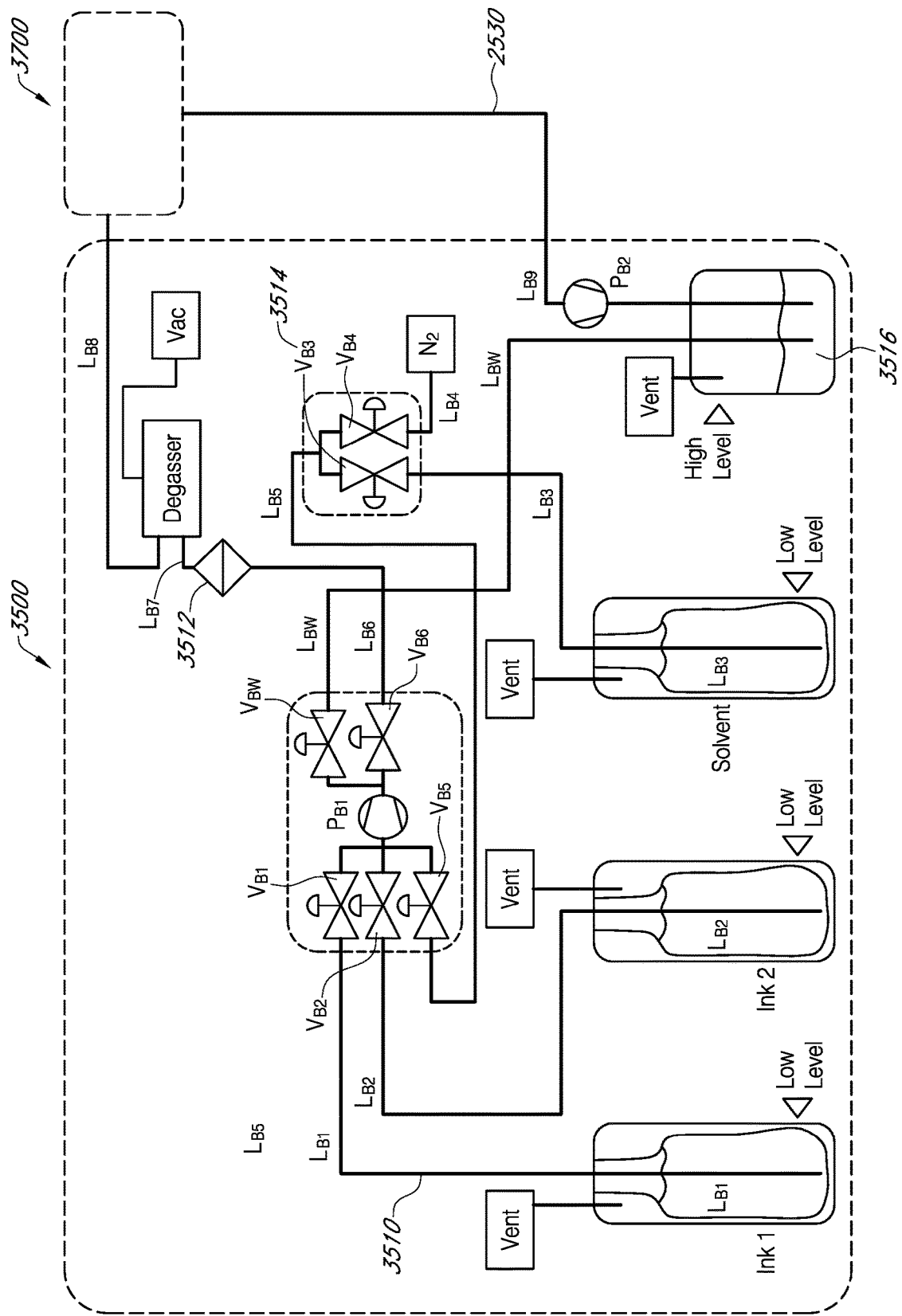
FIG. 7 is a schematic representation of a bulk ink delivery system that illustrates generally various embodiments an enclosed printing system of the present teachings.

In FIG. 7, a schematic depiction of various embodiments of bulk ink delivery system 3500 is shown. As indicated in FIG. 7, bulk ink delivery system 3500 can be in flow communication with various embodiments of local ink delivery system 3700 according to the present teachings. For various embodiments of bulk ink delivery system 3500, pump $P_{B1}$ can be a metering pump that can effectively pump both liquid and gaseous fluids. In that regard, both bulk ink supply system 3510 and maintenance system 3514 of bulk ink delivery system 3500 can utilize metering pump $P_{B1}$ for flow control. As depicted in FIG. 7, metering pump $P_{B1}$ provides a controllable manifold system that has three input lines, with the potential for three output lines; of which two are indicated in FIG. 7, all of which are controlled using metering pump valves as indicated. The number of controllable input and output lines can vary, according to various embodiments of metering pumps. Various embodiments of metering pumps utilized in embodiments of bulk ink delivery systems of the present teachings can have attributes that can include, for example, but not limited by, capable of controlling both liquid and gaseous fluids, corrosion resistant polymeric surfaces in contact with fluid flow to prevent corrosion and contamination, zero dead volume connections preventing cross-contamination, minimum hold-up volume for fast priming using a minimum volume of various inks, and valves with suckback capability.

Bulk ink delivery system (BIDS) 3500 of FIG. 7 can have bulk ink supply system 3510 that can have first BIDS ink supply line $L_{B1}$ in flow communication with a first ink source, and second BIDS ink supply line $L_{B2}$ in flow communication with a second ink source. First BIDS ink supply line $L_{B1}$ and second BIDS ink supply line $L_{B2}$ can controlled by first BIDS valve $V_{B1}$ and second BIDS valve $V_{B2}$, respectively, which can part of the assembly of multi-port metering pump $P_{B1}$, as indicated in FIG. 7. In addition to providing flow control for bulk ink supply system 3510, given the capability that metering pump $P_{B1}$ has for controllably handling a variety of different fluids with minimum hold-up volume, metering pump $P_{B1}$ can also be used for controllably handling maintenance system 3514. For example, in FIG. 7, third BIDS solvent supply line $L_{B3}$ can be in flow communication with a solvent source and forth BIDS gas supply line $L_{B4}$ can be in flow communication with an inert gas source, for example, a nitrogen source as indicated in FIG. 7. Third BIDS solvent supply line $L_{B3}$ and forth BIDS gas supply line $L_{B4}$ can be controlled by third BIDS solvent supply valve $V_{B3}$ and forth BIDS gas supply valve $V_{B4}$, respectively. As depicted in FIG. 7, third BIDS solvent supply line $L_{B3}$ and forth BIDS gas supply line $L_{B4}$ can be in flow communication with fifth BIDS line $L_{B5}$, which can be controlled by fifth BIDS maintenance system supply valve $V_{B5}$. Fifth BIDS maintenance system supply valve $V_{B5}$ can part of the assembly of multi-port metering pump $P_{B1}$, as indicated in FIG. 7. Third BIDS solvent supply line $L_{B3}$, and forth BIDS gas supply line $L_{B4}$ can be joined at a T-junction using two valves, as shown in FIG. 7, or a 3-way valve can be used. Third BIDS solvent supply valve $V_{B3}$ and forth BIDS inert gas supply valve $V_{B4}$ are in a normally closed position during processing, but can be selectively opened during a maintenance procedure, as will be discussed in more detail subsequently, herein.

Initially for various embodiments of systems and methods of FIG. 7, for example, before a printing procedure has begun, priming of ink line through the manifold system of metering pump $P_{B1}$ can be done. For example, once an ink supply is available from first ink supply container Ink 1, first BIDS ink supply line $L_{B1}$ can be primed with ink from Ink 1 by opening first BIDS ink supply valve $V_{B1}$ and BIDS waste line valve $V_{BW}$, while all other valves remain closed. With the valve states so positioned, priming of first BIDS ink supply line $L_{B1}$ can be done, in which there is flow communication between first BIDS ink supply line $L_{B1}$ and bulk ink delivery system waste assembly 3516 through BIDS waste line $L_{BW}$. After priming, during, for example, the initiation of a printing process, first BIDS ink supply valve $V_{B1}$ and sixth BIDS valve $V_{B6}$ of metering pump $P_{B1}$ can be open, while all other valves are closed. With the valve states so positioned, first ink supply container, Ink 1, is in flow communication with bulk ink delivery system 3500, which is in flow communication with local ink delivery system 3700. Second BIDS line $L_{B2}$ can be primed with ink from Ink 2 in a similar fashion as given in the example for priming first BIDS ink supply line $L_{B1}$.

Though two ink supply sources are indicated in FIG. 7, a plurality of ink supply containers can be included in bulk ink supply system 3510, and can act as sequential supply sources of ink. For example, as shown in FIG. 7, when the level of ink in first ink supply container, Ink 1, is at the low level indicator, first BIDS ink supply valve $V_{B1}$ of metering pump $P_{B1}$ can be closed, so that first ink supply container, Ink 1, can be isolated and either refilled or replaced. Following the isolation of Ink 1, second BIDS ink supply valve $V_{B2}$ of metering pump $P_{B1}$ can be opened, so that second ink supply container, Ink 2, can act as the source of ink supply for a gas enclosure system, such as enclosed printing system 500A of FIG. 13. Either one of first BIDS line ink supply $L_{B1}$ or second BIDS ink supply line $L_{B2}$ can be in flow communication with sixth BIDS line $L_{B6}$, depending on which ink supply source is in use. During processes requiring ink flow from bulk ink supply system 3510, first BIDS ink supply valve $V_{B1}$ and sixth BIDS valve $V_{B6}$ of metering pump $P_{B1}$ can be open, while all other valves are closed, allowing flow between first BIDS ink supply line $L_{B1}$ and sixth BIDS line $L_{B6}$. Sixth BIDS line $L_{B6}$ passes through filter 3512 and is in flow communication with seventh BIDS line $L_{B7}$, which is in flow communication with a degasser for removing, for example, but not limited by, dissolved gases in an ink from a bulk ink supply source of bulk ink supply system 3510. Finally, after being degassed, ink can flow through eighth BIDS line $L_{BB}$, which is in flow communication with local ink delivery system 3700.

As previously discussed herein, in addition to bulk ink supply system 3510, bulk ink delivery system 3500 of FIG. 7 can have BIDS maintenance system 3514. BIDS maintenance system 3514 can include third BIDS solvent supply line $L_{B3}$ and forth BIDS gas supply line $L_{B4}$, which can be controlled by third BIDS solvent supply valve $V_{B3}$ and forth BIDS inert gas supply valve $V_{B4}$, respectively. As depicted in FIG. 7, third BIDS solvent supply line $L_{B3}$ and forth BIDS gas supply line $L_{B4}$ can be in flow communication with fifth BIDS line $L_{B5}$. Fifth BIDS line $L_{B5}$ can be controlled by fifth BIDS maintenance system supply valve $V_{B5}$ of metering pump $P_{B1}$. Additionally, for bulk ink delivery system 3500 of FIG. 7, BIDS waste line $L_{BW}$ can be in flow communication with bulk ink delivery system waste assembly 3516. BIDS waste line $L_{BW}$ can be controlled by BIDS waste line valve $V_{BW}$ of metering pump $P_{B1}$. Third BIDS solvent supply valve $V_{B3}$, forth BIDS gas supply valve $V_{B4}$, fifth BIDS maintenance system supply valve $V_{B5}$, and BIDS waste line valve $V_{BW}$ are in a normally closed position during processing, but can be selectively opened during a maintenance procedure.

For example, during a maintenance procedure, the BIDS valves of metering pump $P_{B1}$ associated with bulk ink supply system 3510, BIDS valves $V_{B1}$, $V_{B2}$, and $V_{B6}$, would remain in a closed position. If a maintenance procedure utilizing a solvent purge is implemented, then BIDS valves $V_{B3}$, $V_{B5}$, and $V_{BW}$ can be opened, so that solvent priming can be done through fifth BIDS line $L_{B5}$, which can be in flow communication bulk ink delivery system waste assembly 3516. After priming, during a maintenance procedure utilizing solvent cleaning of, for example, lines within local ink delivery system 3700, then BIDS waste line valve $V_{BW}$ can be closed, and BIDS valves $V_{B3}$, $V_{B5}$, and $V_{B6}$ can be opened, so that solvent can flow through fifth BIDS line $L_{B5}$, which can be in flow communication with sixth BIDS line $L_{B6}$. Sixth BIDS line $L_{B6}$ is in flow communication with local ink delivery system 3700, as described herein, providing solvent flow throughout local ink delivery system 3700, and eventually to bulk ink delivery system waste assembly 3516 through ninth BIDS line $L_{B9}$. Additionally, if a maintenance procedure utilizing an inert gas is implemented, then BIDS valves $V_{B4}$, $V_{B5}$, and $V_{B6}$ can be opened, so that inert gas can flow through fifth BIDS line $L_{B5}$, which can be in flow communication with sixth BIDS line $L_{B6}$. Sixth BIDS line $L_{B6}$ is in flow communication with local ink delivery system 3700, as described herein.

Figure 8A:
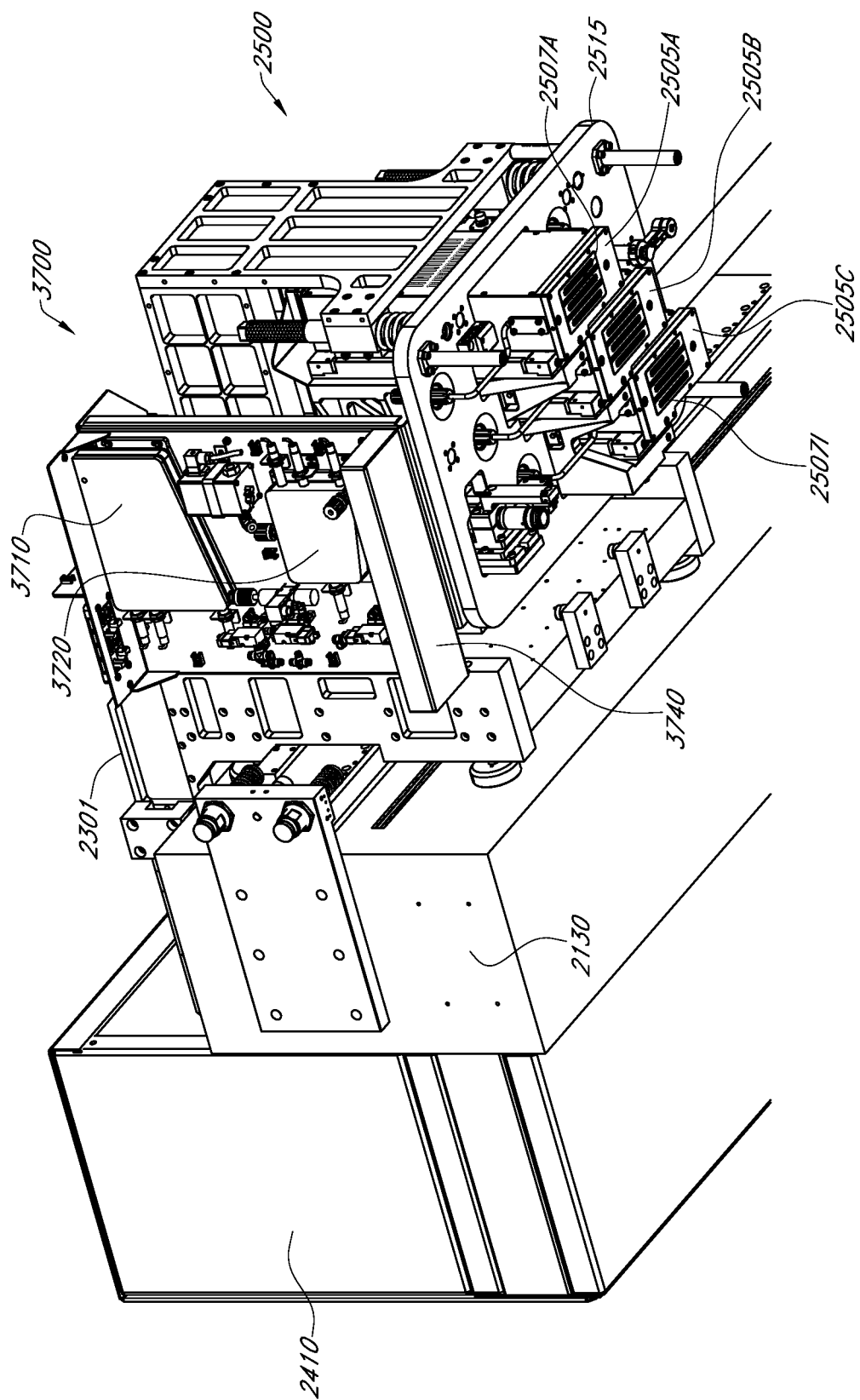
FIG. 8A illustrates generally a bottom perspective view of a printhead device assembly mounted on an X-axis bridge for an enclosed printing system according to various embodiments of the present teachings.

FIG. 8A is a bottom perspective view of printhead device assembly 2500, mounted on a printhead device assembly positioning system, such as first X-axis carriage assembly 2301 (see also FIG. 3). First X-axis carriage assembly 2301 can be positioned in an X-axis direction on printing system bridge 2130 relative to a substrate, such as substrate 2050 of FIG. 3. As shown in FIG. 8A, service bundle housing 2410 is mounted to printing system bridge 2130. Service bundle housing 2410 can contain various service bundles operatively connected from various apparatuses and system to a gas enclosure system including a printing system. Various embodiments of a service bundle can include bundled optical cables, electrical cables, wires and tubing, and the like, for providing optical, electrical, mechanical, and fluidic functions for various assemblies and systems disposed within the interior of the gas enclosure system. As will be discussed in more detail subsequently herein in regard to FIG. 10A and FIG. 10B, flow communication between a bulk ink delivery system and a local ink delivery system of can occur by a fluid line running through a service bundle housing to local ink delivery system. During various process steps, such as printing and maintenance steps, as X-axis carriage assembly 2301 moves printhead device assembly 2500 across printing system bridge 2130, various service bundles move accordingly. Therefore, liquid ink lines in such service bundles are subject to continuous flexure and wear. According to systems and methods of the present teachings, a bulk ink delivery system external a gas enclosure system can be in fluid communication with a local ink delivery system internal to a gas enclosure system utilizing a double conduit system, in which an ink line is run through a conduit, which can be in flow communication with a bulk waste assembly. In that regard, should an ink line develop a leak, the liquid can run through the outer conduit to waste.

As depicted in FIG. 8A printhead device assembly 2500 can have printhead devices 2505A, 2505B, and 2505C, which can be substantially housed within a printhead device assembly enclosure (not shown) and mounted to printhead device assembly mounting plate 2515. Printhead devices 2505A, 2505B, and 2505C can be mounted to printhead device assembly mounting plate 2515, so that each printhead device can extend through printhead device assembly mounting plate 2515 to be positioned relative to a substrate, such as substrate 2050 of FIG. 3. For various embodiments of printing system 2000 of FIG. 3 or printing system 2000A of FIG. 5A, a printhead device assembly can include between about 1 to about 60 printhead devices, where each printhead device can have between about 1 to about 30 printheads in each printhead device. As depicted in FIG. 8A, according to systems and methods of the present teachings, printhead device assembly 2500 can have three printhead devices, where each printhead device as depicted in FIG. 6A and FIG. 6B can three printheads; 2507A through 2507I. As depicted in FIG. 8A, printhead device assembly 2500 can be in flow communication with local ink delivery system 3700, as additionally depicted in FIG. 6A and FIG. 6B. As depicted in FIG. 8A, local ink delivery system 3700 can have local ink replenishment reservoir 3710, which can be in flow communication with local ink dispensing reservoir 3720. Local ink delivery system drip pan 3740 can be configured to provide collection of liquid, such as ink or solvent used to clean ink lines, thereby protecting the printing system situated below local ink delivery system 3700 from fluid leakage. As previously discussed herein for FIG. 6A and FIG. 6B, local ink dispensing reservoir 3720 can be in flow communication with each printhead device, 2505A, 2505B, and 2505C; each printhead device of which is depicted having three printheads. According to systems and methods of the present teachings, printhead device assembly 2500 can accommodate any of an end-user selected printheads. As previously discussed in herein, given the number of printhead devices and printheads requiring continual maintenance, printhead device assembly 2500 can be positioned over a maintenance system in an auxiliary enclosure, as depicted in FIG. 2 through FIG. 4, for ready placement or replacement of a printhead device or a printhead.

Figure 8B:
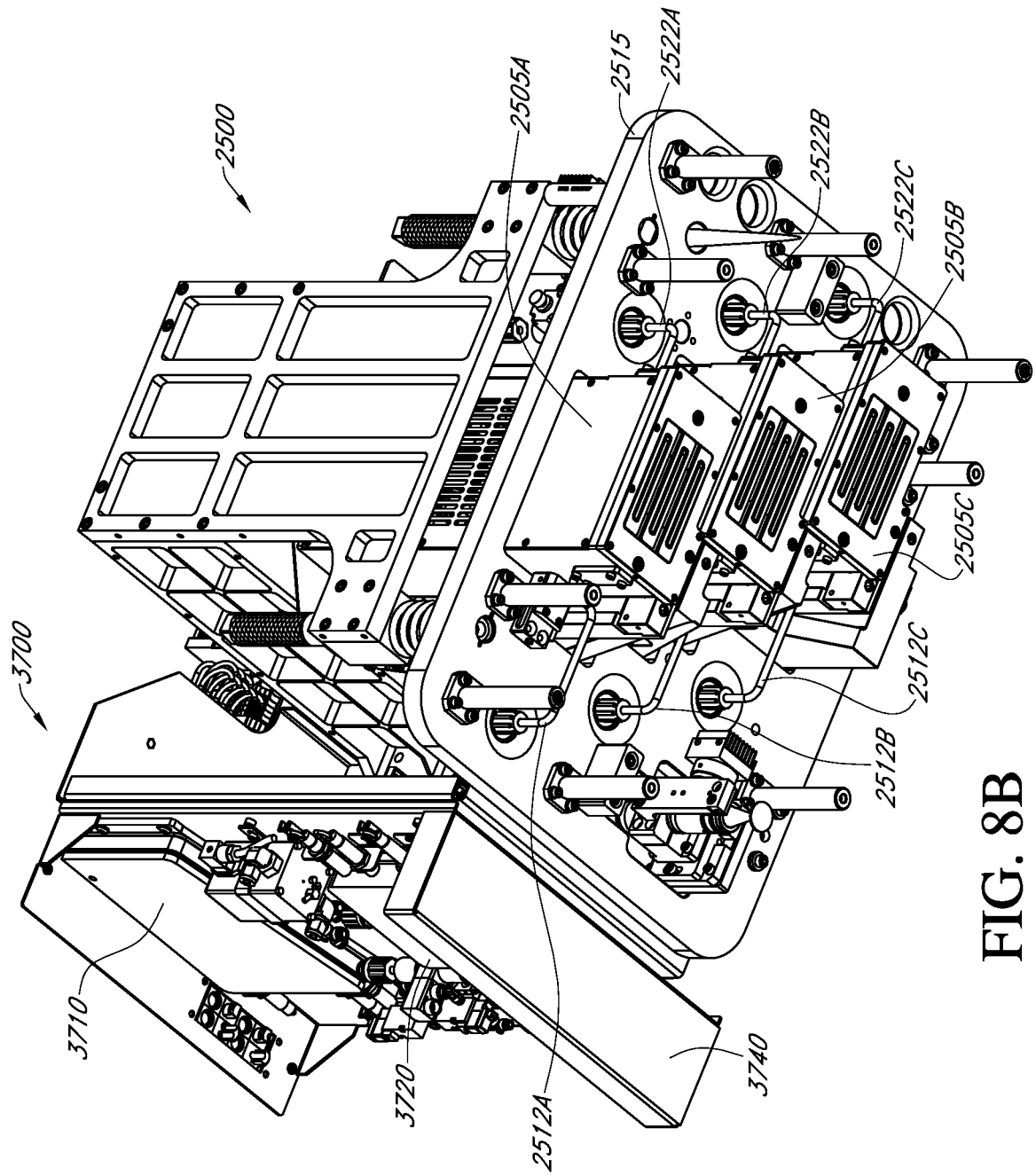
FIG. 8B illustrates generally an expanded bottom perspective view of a printhead device assembly as in FIG. 8A.

As illustrated generally in the expanded bottom perspective view of FIG. 8B, printhead device assembly 2500 can have printhead devices 2505A, 2505B, and 2505C. As previously mentioned herein, printhead devices 2505A, 2505B, and 2505C can be substantially housed within printhead device assembly enclosure (not shown) and mounted to printhead device assembly mounting plate 2515, so that the printhead devices can extend through printhead device assembly mounting plate 2515 to be positioned relative to a substrate, such as substrate 2050 of FIG. 3. As depicted schematically in FIG. 6A and FIG. 6B, and illustrated generally in FIG. 8B, each printhead device can have a supply manifold inlet line, as well as a return manifold outlet line. Printhead device assembly supply manifold 2510 of FIG. 6A can have supply manifold inlet line 2512A, supply manifold inlet line 2512B, and supply manifold inlet line 2512C, in flow communication with printhead device 2505A, printhead device 2505B, and printhead device 2505C, respectively, as depicted schematically in FIG. 6A and FIG. 6B and illustrated generally in FIG. 8B. Similarly, on the outlet side, printhead device 2505A, printhead device 2505B, and printhead device 2505C, can be in flow communication with printhead device assembly return manifold 2520, as depicted schematically in FIG. 6A and FIG. 6B. Printhead device assembly return manifold 2520 of FIG. 6A can be in flow communication with return manifold outlet line 2522A, return manifold outlet line 2522B, and return manifold outlet line 2522C, as depicted schematically in FIG. 6A and FIG. 6B, and illustrated generally in FIG. 8B. Return manifold outlet line 2522A, return manifold outlet line 2522B, and return manifold outlet line 2522C can be in flow communication with printhead device assembly outlet line 2506, as depicted schematically in FIG. 6A and FIG. 6B. Additionally, as illustrated generally in FIG. 8B, local ink delivery system 3700 can be mounted proximal to printhead device assembly 2500. Local ink delivery system 3700 can include local ink replenishment reservoir 3710 and local ink dispensing reservoir 3720, as well as local ink delivery system drip pan 3740.

According to various systems and methods of the present teaching a printhead device, such as printhead devices 2505A, 2505B, and 2505C of FIG. 8A and FIG. 8B can be manually or automatically inserted from the bottom of printhead device assembly 2500. For example, as depicted in FIG. 4 printhead installation or replacement can be done robotically. As previously discussed herein in reference to FIG. 2 through FIG. 4, a gas enclosure, such as gas enclosure 1000A, can have auxiliary enclosure 1330, which can enclose printhead management system 2701. In FIG. 4, the installation or replacement of a printhead device or printhead, can be done in auxiliary enclosure 1330 using robot 2530. Printhead replacement module 2713 of printhead management system 2701 FIG. 4 can include a docking station for a printhead device having at least one printhead, as well as a storage receptacle for a plurality of printhead devices, as well as a plurality of printheads. Each printhead device assembly of the present teachings can include between about 1 to about 60 printhead devices, and as each printhead device can have between about 1 to about 30 printheads. Accordingly, in addition to having between 1 to about 60 printhead devices, various embodiments of a printing system of the present teachings can have between about 1 to about 1800 printheads; all of which require occasional maintenance.

Figure 9:
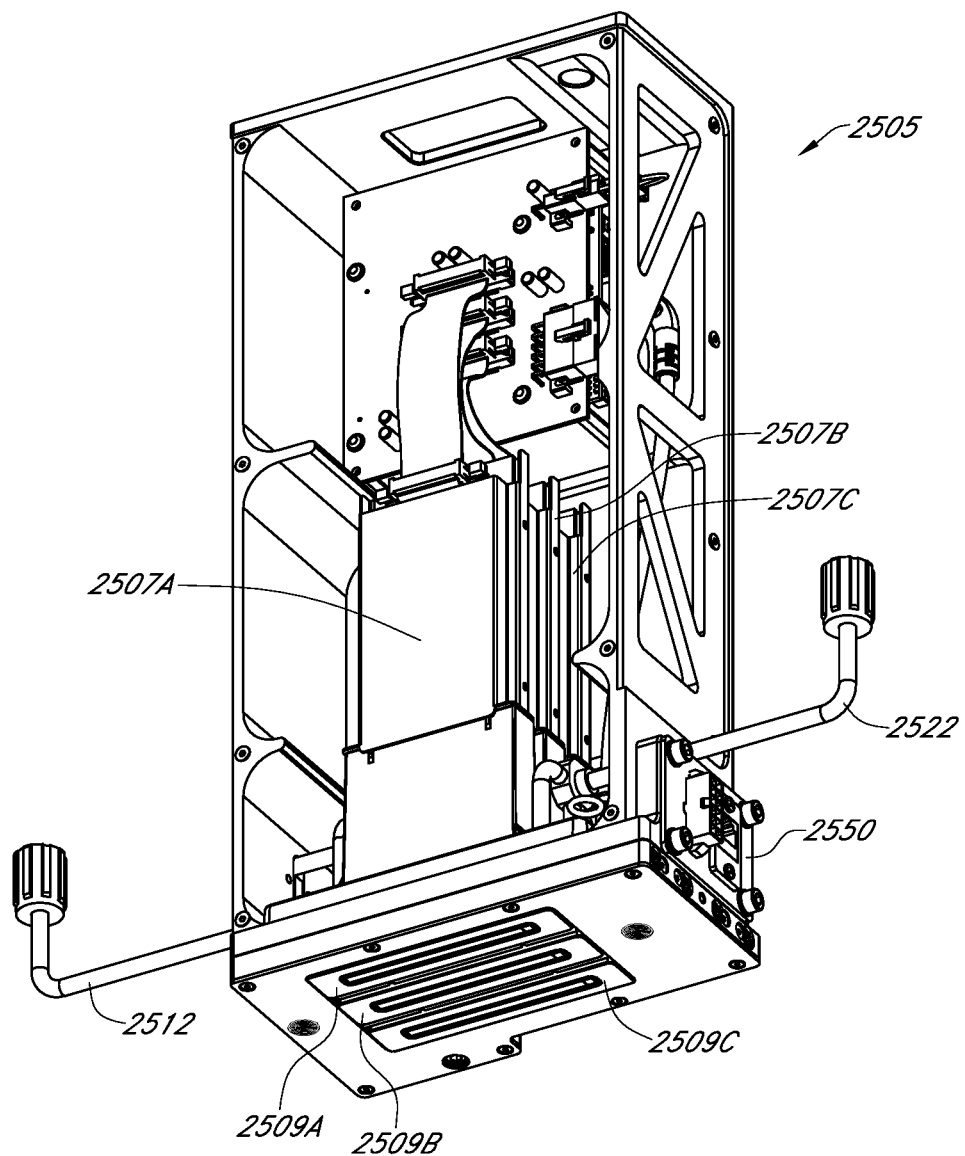
FIG. 9 illustrates generally a bottom front perspective view of a printhead device according to various embodiments of the present teachings.

Printhead device 2505, as illustrated generally in FIG. 9, can include a plurality of printheads, such as printheads 2507A, 2507B, and 2507C. As previously mentioned, printhead device 2505 can accommodate any of an end-user selected printhead; each printhead device having at least one printhead. As illustrated in FIG. 9, printheads 2507A, 2507B, and 2507C can have printhead nozzle plates 2509A, 2509B, and 2509C, respectively. Printhead device 2505 can have printhead device electrical bulk head 2550, which can provide electrical service to each printhead. Additionally, printhead device 2505 can have supply manifold inlet line 2512 and return manifold outlet line 2522, which provide flow communication to an ink supply and a local waste reservoir assembly, respectively.

Figure 10A:
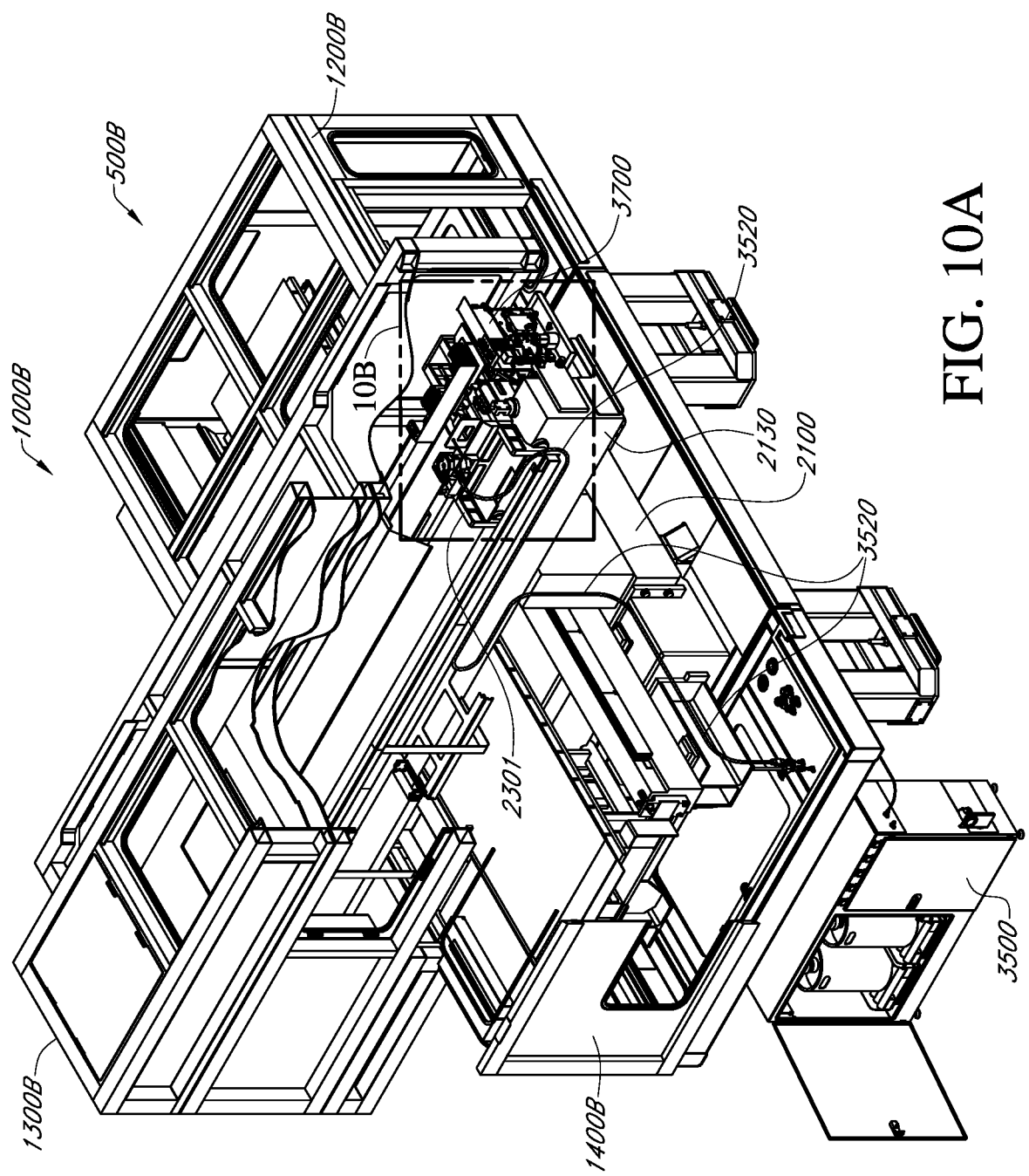
FIG. 10A illustrates generally a perspective view of a printing system that includes a bulk ink delivery system and a local ink delivery system according to various embodiments of the present teachings.

FIG. 10A illustrates generally a perspective view of enclosed printing system 500B, which can have all of the features as described herein for enclosed printing system 500B of FIG. 5D. Gas enclosure 1000B of FIG. 10A can include first tunnel enclosure section 1200B, bridge enclosure section 1300B, and second tunnel enclosure section 1400B. A printing system, such as printing system 2000B of FIG. 5D, can be housed within gas enclosure 1000B. In the perspective view of FIG. 10A, printing system base 2100 is shown, as well as bridge 2130. Upon bridge 2130, carriage assembly 2301, for which various embodiments have been described herein, is mounted. As depicted in FIG. 10A, local ink delivery system is mounted to carriage assembly 2301 proximal to a printhead device assembly. Bulk ink delivery system 3500 is shown positioned exterior enclosed printing system 500B. Extending from bulk ink delivery system 3500 is ink delivery line 3520, which provides flow communication between bulk ink delivery system 3500 and local ink delivery system 3700, such as described herein for $L_{B8}$ of FIG. 7. Ink delivery line 3520 is depicted as routed through second tunnel enclosure section 1400B of gas enclosure 1000B, and through a service bundle housing (not shown; see for example, service bundle housing 2410 of FIG. 8A).

Figure 10B:
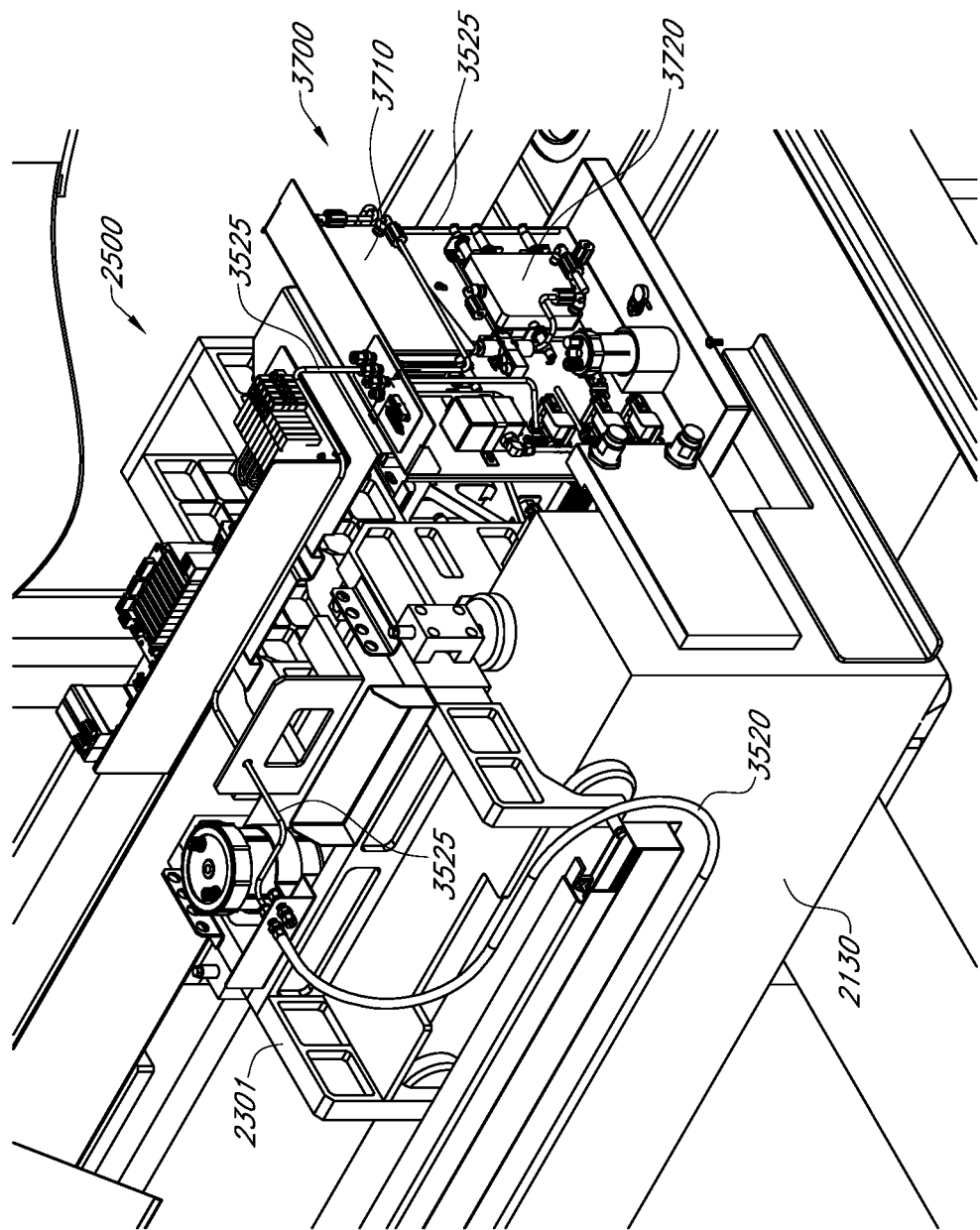
FIG. 10B is an expanded view of a portion of FIG. 10A, as indicated in FIG. 10A.

As depicted in FIG. 10A, and shown in the expanded view of FIG. 10B, the routing of ink delivery line 3520 continues from the service bundle housing and around the exterior carriage assembly 2301 to local ink replenishment reservoir 3710 of local ink delivery system 3700. Local ink replenishment reservoir 3710 is in flow communication with local ink dispensing reservoir 3720, as described herein, for example, but not limited by, for FIG. 6A and FIG. 6B. As depicted in FIG. 10B, local ink delivery system 3700 is mounted on carriage assembly 2301 proximal to printhead device assembly 2500. As described herein, for example, but not limited by, for FIG. 5A through FIG. 6B, as well as FIG. 8A and FIG. 8B, local ink delivery system 3700 is in flow communication with printhead device assembly 2500. According to the present teachings, local ink delivery system 3700, shown proximal to a printhead device assembly 2500, can have a two-stage ink supply. As depicted in FIG. 10A, local ink replenishment reservoir 3710 is proximal to local ink dispensing reservoir 3720.

As previously discussed herein with respect to FIG. 6A and FIG. 6B, local ink delivery system 3700 is configured with liquid level indicators that can be part of a dynamic liquid level control system that can ensure that a sufficient level of an ink is supplied from bulk ink delivery system 3500 to local ink replenishment reservoir 3710. Additionally, local ink replenishment reservoir 3710 is configured to supply ink to local ink dispensing reservoir 3720 to a constant level. According to the present teachings, a local ink dispensing reservoir can be in flow communication with a plurality of printhead devices. As such, a two-stage local ink delivery system maintaining a constant level in a local ink dispensing reservoir can provide constant head pressure to the plurality of printhead devices.

Figure 11:
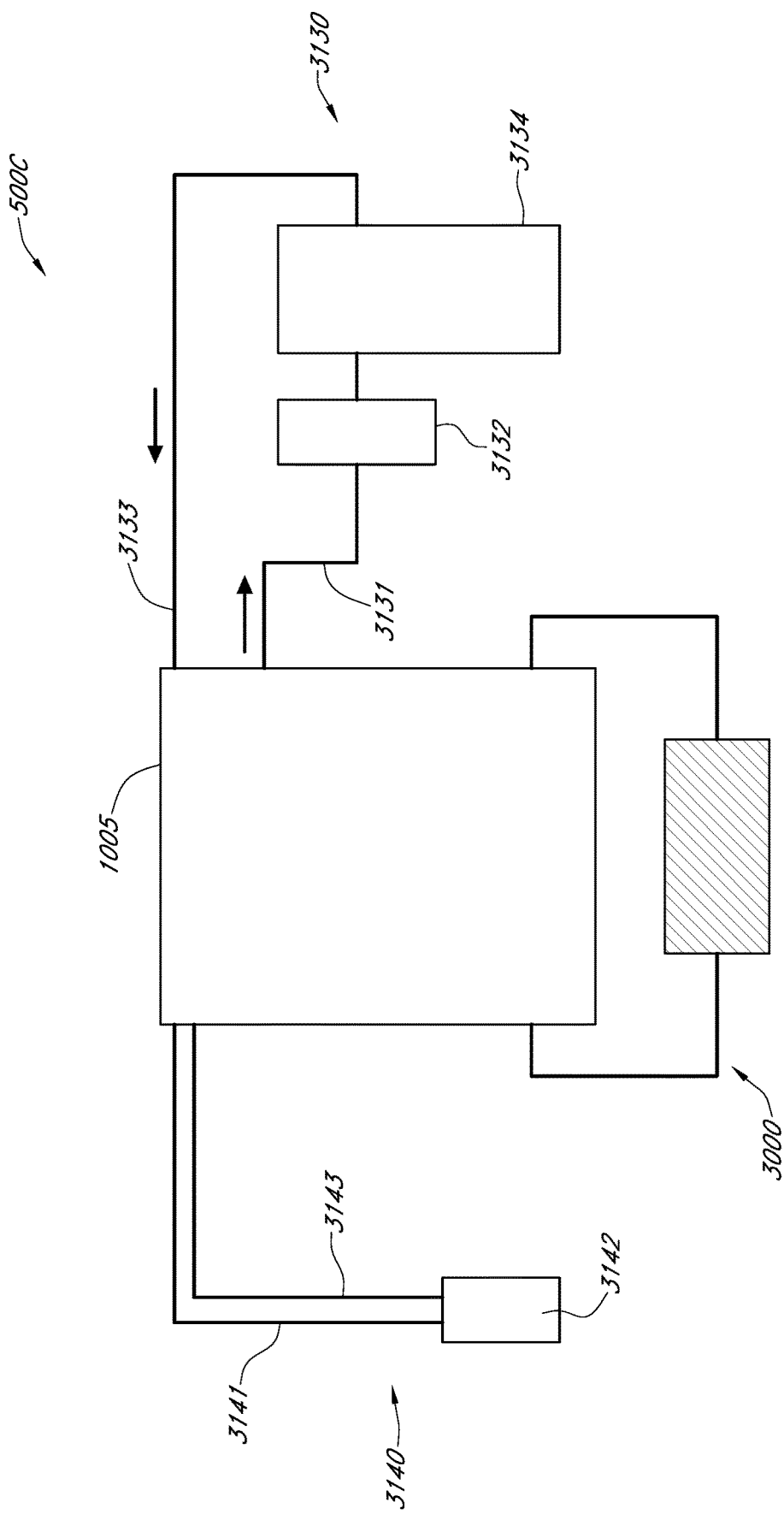
FIG. 11 illustrates generally a schematic view of various embodiments of gas enclosure assembly and related system components the present teachings.

FIG. 11 is a schematic diagram showing enclosed printing system 500C utilizing gas enclosure assembly 1005. Various embodiments of enclosed printing system 500C according to the present teachings can comprise gas enclosure assembly 1000B for housing a printing system, gas purification loop 3130 in fluid communication gas enclosure assembly 1000B, and at least one thermal regulation system 3140. Additionally, various embodiments of enclosed printing system 500C can have pressurized inert gas recirculation system 3000, which can supply inert gas for operating various devices, such as a substrate floatation table for a printing system. Various embodiments of a pressurized inert gas recirculation system 3000 can utilize a compressor, a blower and combinations of the two as sources for various embodiments of pressurized inert gas recirculation system 3000, as will be discussed in more detail subsequently herein. Additionally, enclosed printing system 500C can have a circulation and filtration system internal to enclosed printing system 500C (not shown).

As depicted in FIG. 11, for various embodiments of a gas enclosure assembly according to the present teachings, the design of a filtration system can separate the inert gas circulated through gas purification loop 3130 from the inert gas that is continuously filtered and circulated internally for various embodiments of a gas enclosure assembly. Gas purification loop 3130 includes outlet line 3131 from gas enclosure assembly 1000B, to a solvent removal component 3132 and then to gas purification system 3134. Inert gas purified of solvent and other reactive gas species, such as oxygen, ozone and water vapor, are then returned to gas enclosure assembly 1000B through inlet line 3133. Gas purification loop 3130 may also include appropriate conduits and connections, and sensors, for example, oxygen, ozone, water vapor and solvent vapor sensors. A gas circulating unit, such as a fan, blower or motor and the like, can be separately provided or integrated, for example, in gas purification system 3134, to circulate gas through gas purification loop 3130. According to various embodiments of a gas enclosure assembly, though solvent removal system 3132 and gas purification system 3134 are shown as separate units in the schematic shown in FIG. 11, solvent removal system 3132 and gas purification system 3134 can be housed together as a single purification unit.

Gas purification loop 3130 of FIG. 11 can have solvent removal system 3132 placed upstream of gas purification system 3134, so that inert gas circulated from gas enclosure assembly 1000B passes through solvent removal system 3132 via outlet line 3131. According to various embodiments, solvent removal system 3132 may be a solvent trapping system based on adsorbing solvent vapor from an inert gas passing through solvent removal system 3132 of FIG. 11. A bed or beds of a sorbent, for example, but not limited by, such as activated charcoal, molecular sieves, and the like, may effectively remove a wide variety of organic solvent vapors. For various embodiments of a gas enclosure system cold trap technology may be employed to remove solvent vapors in solvent removal system 3132. As previously discussed herein, for various embodiments of a gas enclosure system according to the present teachings, sensors, such as oxygen, ozone, water vapor and solvent vapor sensors, may be used to monitor the effective removal of such species from inert gas continuously circulating through a gas enclosure system, such as enclosed printing system 500C of FIG. 11. Various embodiments of a solvent removal system can indicate when sorbent, such as activated carbon, molecular sieves, and the like, has reached capacity, so that the bed or beds of sorbent can be regenerated or replaced. Regeneration of a molecular sieve can involve heating the molecular sieve, contacting the molecular sieve with a forming gas, a combination thereof, and the like. Molecular sieves configured to trap various species, including oxygen, ozone, water vapor, and solvents, can be regenerated by heating and exposure to a forming gas that comprises hydrogen, for example, a forming gas comprising about 96% nitrogen and 4% hydrogen, with said percentages being by volume or by weight. Physical regeneration of activated charcoal can be done using a similar procedure of heating under an inert environment.

Any suitable gas purification system can be used for gas purification system 3134 of gas purification loop 3130 of FIG. 11. Gas purification systems available, for example, from MBRAUN Inc., of Statham, N.H., or Innovative Technology of Amesbury, Mass., may be useful for integration into various embodiments of a gas enclosure assembly according to the present teachings. Gas purification system 3134 can be used to purify one or more inert gases in enclosed printing system 500C, for example, to purify the entire gas atmosphere within a gas enclosure assembly. As previously discussed herein, in order to circulate gas through gas purification loop 3130, gas purification system 3134 can have a gas circulating unit, such as a fan, blower or motor, and the like. In that regard, a gas purification system can be selected depending on the volume of the enclosure, which can define a volumetric flow rate for moving an inert gas through a gas purification system. For various embodiments of gas enclosure system having a gas enclosure assembly with a volume of up to about 4 m$^3$; a gas purification system that can move about 84 m$^3$/h can be used. For various embodiments of gas enclosure system having a gas enclosure assembly with a volume of up to about 10 m$^3$; a gas purification system that can move about 155 m$^3$/h can be used. For various embodiments of a gas enclosure assembly having a volume of between about 52-114 m$^3$, more than one gas purification system may be used.

Any suitable gas filters or purifying devices can be included in the gas purification system 3134 of the present teachings. In some embodiments, a gas purification system can comprise two parallel purifying devices, such that one of the devices can be taken off line for maintenance and the other device can be used to continue system operation without interruption. In some embodiments, for example, the gas purification system can comprise one or more molecular sieves. In some embodiments, the gas purification system can comprise at least a first molecular sieve, and a second molecular sieve, such that, when one of the molecular sieves becomes saturated with impurities, or otherwise is deemed not to be operating efficiently enough, the system can switch to the other molecular sieve while regenerating the saturated or non-efficient molecular sieve. A control unit can be provided for determining the operational efficiency of each molecular sieve, for switching between operation of different molecular sieves, for regenerating one or more molecular sieves, or for a combination thereof. As previously discussed herein, molecular sieves may be regenerated and reused.

Thermal regulation system 3140 of FIG. 11 can include at least one chiller 3142, which can have fluid outlet line 3141 for circulating a coolant into a gas enclosure assembly, and fluid inlet line 3143 for returning the coolant to the chiller. An at least one fluid chiller 3142 can be provided for cooling the gas atmosphere within enclosed printing system 500C. For various embodiments of a gas enclosure system of the present teachings, fluid chiller 3142 delivers cooled fluid to heat exchangers within the enclosure, where inert gas is passed over a filtration system internal the enclosure. At least one fluid chiller can also be provided with enclosed printing system 500C to cool heat evolving from an apparatus enclosed within enclosed printing system 500C. For example, but not limited by, at least one fluid chiller can also be provided for enclosed printing system 500C to cool heat evolving from a printing system. Thermal regulation system 3140 can comprise heat-exchange or Peltier devices and can have various cooling capacities. For example, for various embodiments of a gas enclosure system, a chiller can provide a cooling capacity of from between about 2 kW to about 20 kW. Various embodiments of a gas enclosure system can have a plurality of fluid chillers that can chill one or more fluids. In some embodiments, the fluid chillers can utilize a number of fluids as coolant, for example, but not limited by, water, anti-freeze, a refrigerant, and a combination thereof as a heat exchange fluid. Appropriate leak-free, locking connections can be used in connecting the associated conduits and system components.

As previously discussed herein, the present teachings disclose various embodiments of a gas enclosure system that can include a printing system enclosure defining a first volume and an auxiliary enclosure defining a second volume. Various embodiments of a gas enclosure system can have an auxiliary enclosure that can be sealably constructed as a section of gas enclosure assembly. According to systems and methods of the present teachings, an auxiliary enclosure can be sealable isolated from a printing system enclosure, and can be opened to an environment external a gas enclosure assembly without exposing a printing system enclosure to the external environment. Such physical isolation of an auxiliary enclosure to perform, for example, but not limited by, various printhead management procedures, can be done to eliminate or minimize the exposure of a printing system enclosure to contamination, such as a gas environment containing reactive species that may degrade materials used in a printing process, for example, but not limited by oxygen, ozone, water vapor and various organic vapors, as well as particulate contamination. Various printhead management procedures that can include measurement and maintenance procedures on a printhead device or a printhead can be done with little or no interruption of a printing process, thereby minimizing or eliminating gas enclosure system downtime.

For a gas enclosure system having a printing system enclosure defining a first volume and an auxiliary enclosure defining a second volume, both volumes can be readily integrated with gas circulation, filtration and purification components to form a gas enclosure system that can sustain an inert, substantially low-particle environment for processes requiring such an environment with little or no interruption of a printing process. According to various systems and methods of the present teachings, a printing system enclosure may be introduced to a level of contamination that is sufficiently low that a purification system can remove the contamination before it can affect a printing process. Various embodiments of an auxiliary enclosure can be a substantially smaller volume of the total volume of a gas enclosure assembly and can be readily integrated with gas circulation, filtration and purification components to form an auxiliary enclosure system that can rapidly recover an inert, of a low-particle environment after exposure to an external environment, thereby providing little or no interruption of a printing process.

Additionally, various embodiments of an auxiliary enclosure can be readily integrated with a dedicated set of environmental regulation system components, such as lighting, gas circulation and filtration, gas purification, and thermostating components. In that regard, various embodiments of a gas enclosure system that include an auxiliary enclosure that can be sealably isolated as a section of gas enclosure assembly can have a controlled environment that is set to be uniform with a first volume defined by a gas enclosure assembly housing a printing system. Further, various embodiments of a gas enclosure system including an auxiliary enclosure that can be sealably isolated as a section of gas enclosure assembly can have a controlled environment that is set to be different than the controlled environment of a first volume defined by a gas enclosure assembly housing a printing system.

While the examples above mentioning cooling capacities and chilling applications, the examples above can also be applied to applications where including buffering of substrates in a controlled environment, or for applications where circulating gas can be maintained at a temperature similar to other portions of the system, such as to avoid unwanted heat transfer from substrates being fabricated or to avoid disruption of temperature uniformity across a substrate or between substrates.

Figure 12A:
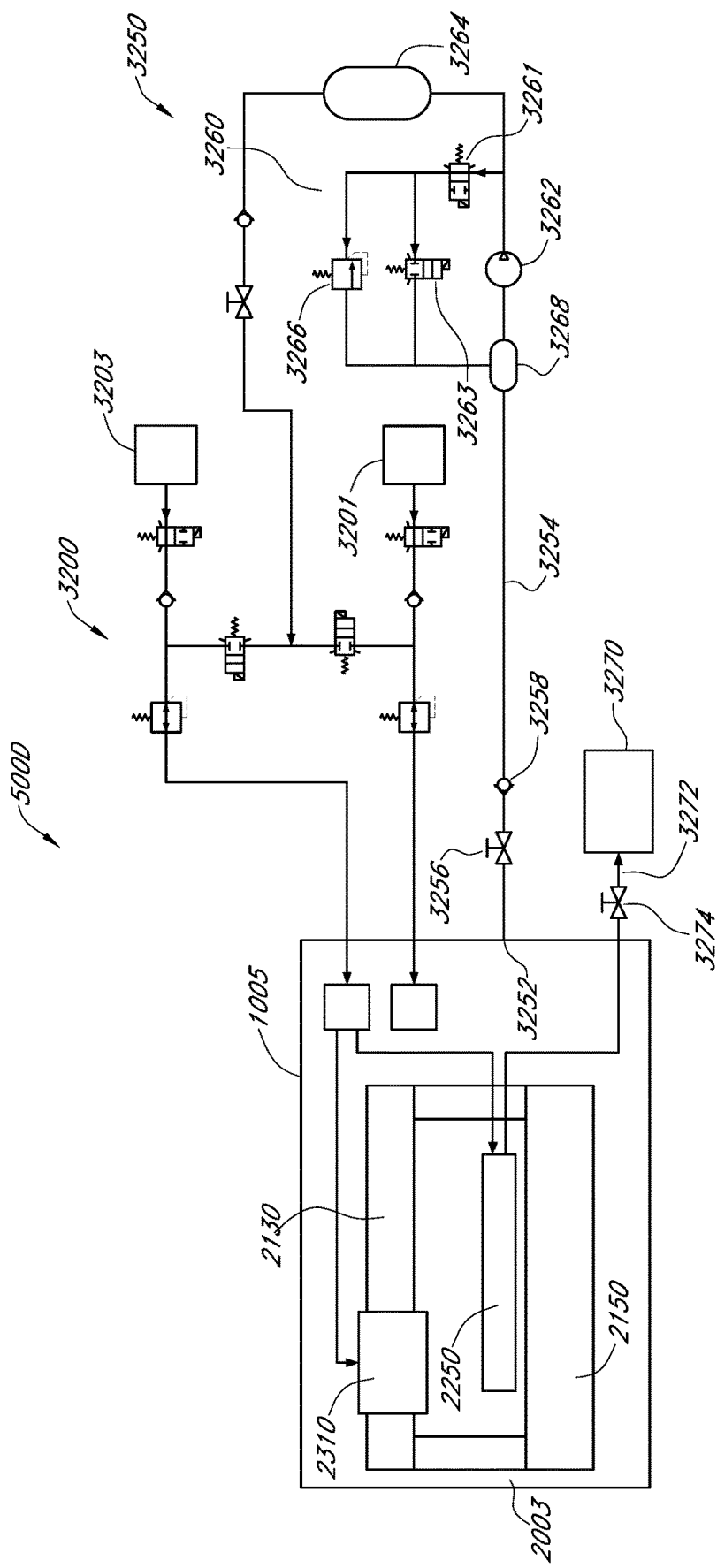
FIG. 12A and FIG. 12B are schematic views that illustrate generally various embodiments of an enclosed printing system and components for integrating and controlling gas sources such as can be used to establish a controlled gas environment in a gas enclosure.
Figure 12B:
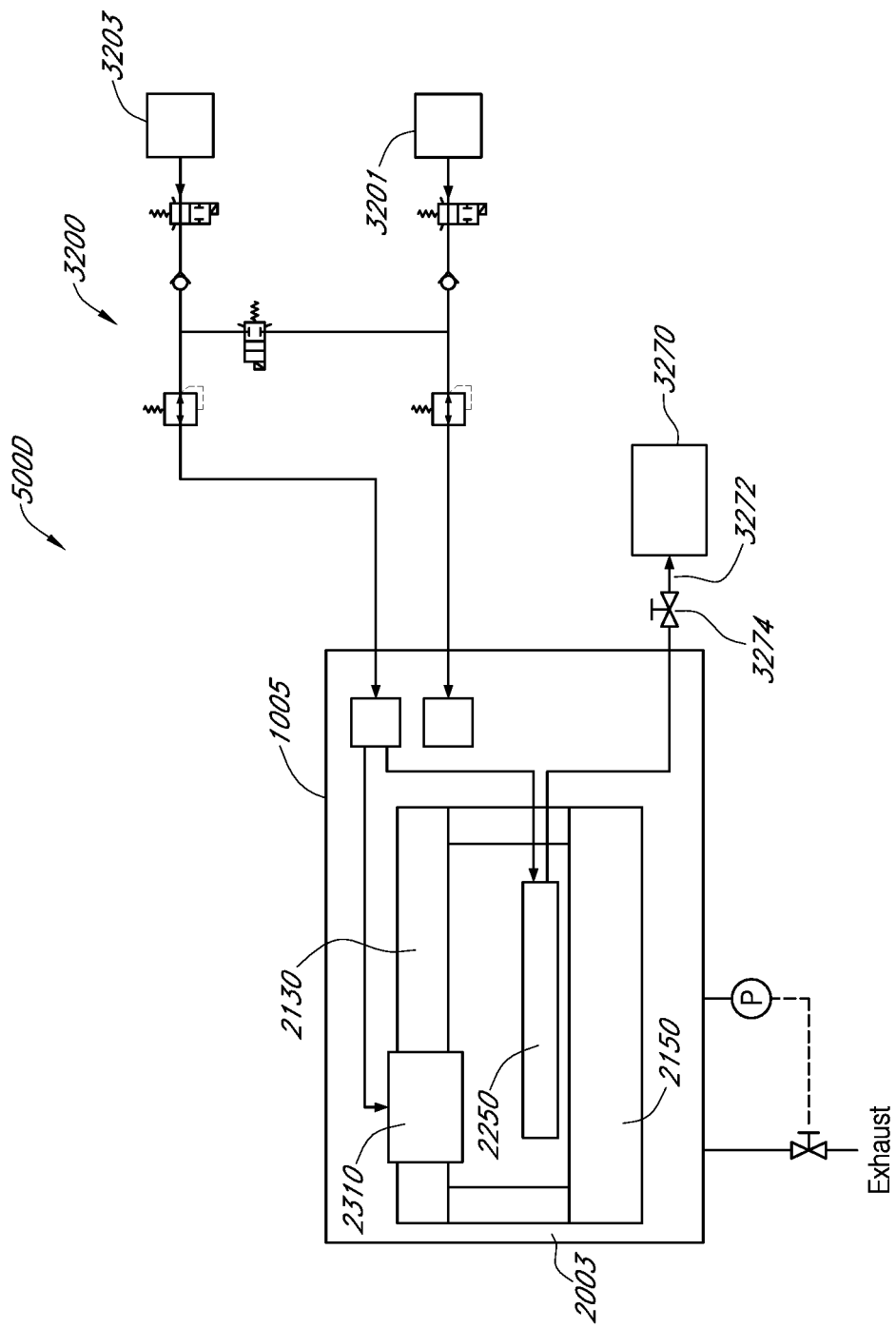
Figure 13A:
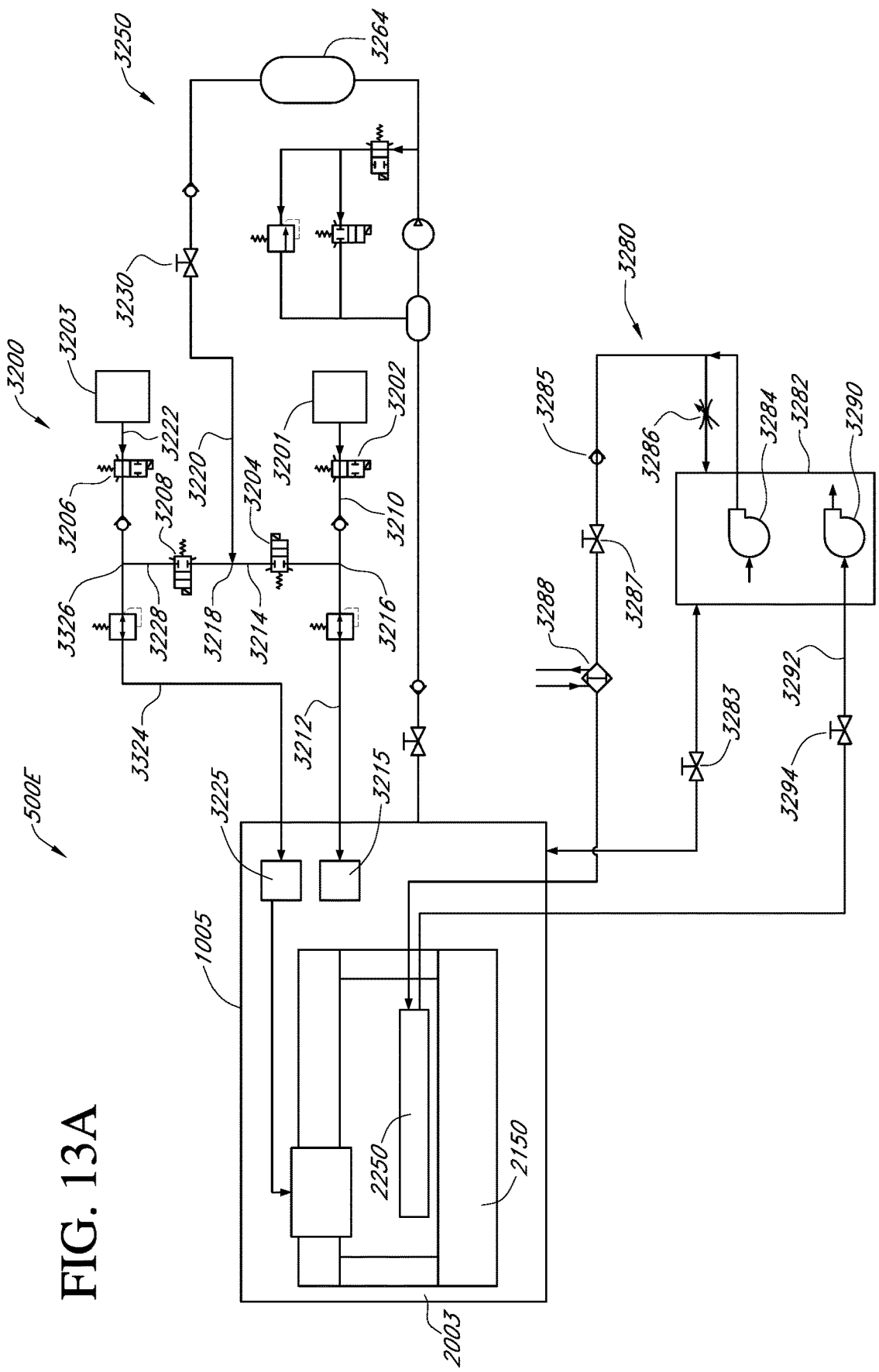
FIG. 13A and FIG. 13B are schematic views that illustrate generally various embodiments of an enclosed printing system and components for integrating and controlling gas sources such as can be used to establish a controlled gas environment in a gas enclosure.
Figure 13B:
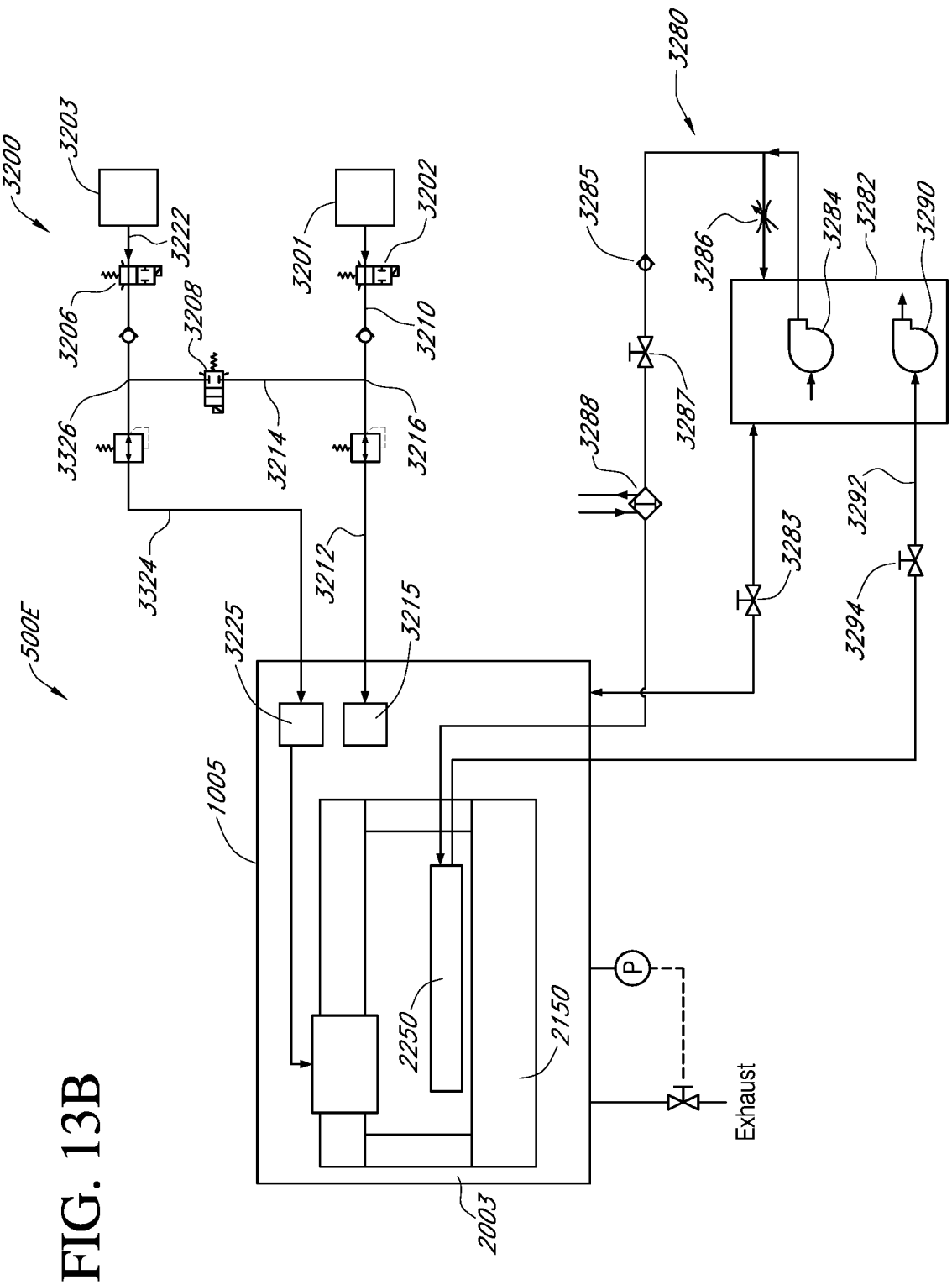
Figure 14:
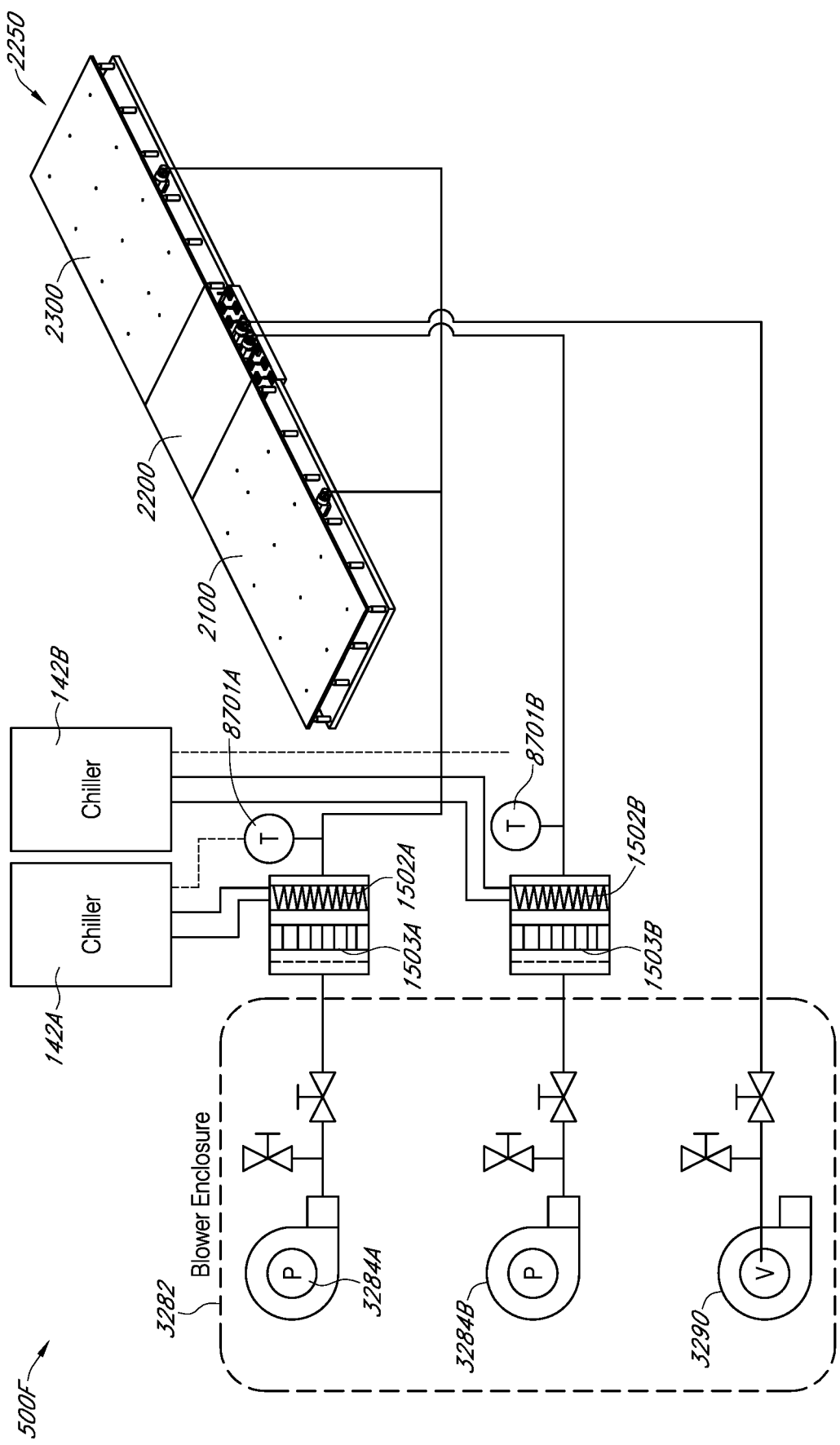
FIG. 14 is a schematic view that illustrates generally components for integrating and controlling gas sources such as can be used to provide a gas source to various apparatuses in a printing system of the present teachings, as well as to establish a controlled gas environment in a gas enclosure.

FIGS. 12A and 12B illustrate generally examples of a gas enclosure system for integrating and controlling non-reactive gas and clean dry air (CDA) sources such as can be used to establish the controlled environment referred to in other examples described elsewhere herein, and such as can include a supply of pressurized gas for use with a floatation table. FIG. 13A and FIG. 13B illustrate generally examples of a gas enclosure system for integrating and controlling non-reactive gas and clean dry air (CDA) sources such as can be used to establish the controlled environment referred to in other examples described elsewhere herein, and such as can include a blower loop to provide, for example, pressurized gas and at least partial vacuum for use with a floatation table. FIG. 14 illustrates generally a further example of a system for integrating and controlling one or more gas or air sources, such as to establish floatation control zones included as a portion of a floatation conveyance system.

Various examples described herein include enclosed modules that can be environmentally-controlled. Enclosure assemblies and corresponding support equipment can be referred to as a "gas enclosure system" and such enclosure assemblies can be constructed in a contoured fashion that reduces or minimizes an internal volume of a gas enclosure assembly, and at the same time provides a working volume for accommodating various footprints of printing system components, such as the deposition (e.g., printing), holding, loading, or treatment modules described herein. For example, a contoured gas enclosure assembly according to the present teachings can have a gas enclosure volume of between about 6 m$^3$ to about 95 m$^3$ for various examples of a gas enclosure assembly of the present teachings covering, for example, substrate sizes from Gen 3.5 to Gen 10. Various examples of a contoured gas enclosure assembly according to the present teachings can have a gas enclosure volume of, for example, but not limited by, of between about 15 m$^3$ to about 30 m$^3$, which might be useful for printing of, for example, but not limited by, Gen 5.5 to Gen 8.5 substrate sizes or other substrate sizes. Various examples of an auxiliary enclosure can be constructed as a section of gas enclosure assembly and readily integrated with gas circulation and filtration, as well as purification components to form a gas enclosure system that can sustain a controlled, substantially low-particle environment for processes requiring such an environment.

As shown in FIG. 12A and FIG. 13A, various examples of a gas enclosure system can include a pressurized non-reactive gas recirculation system. Various examples of a pressurized gas recirculation loop can utilize a compressor, a blower and combinations thereof. According to the present teachings, several engineering challenges were addressed in order to provide for various examples of a pressurized gas recirculation system in a gas enclosure system. First, under typical operation of a gas enclosure system without a pressurized non-reactive gas recirculation system, a gas enclosure system can be maintained at a slightly positive internal pressure (e.g., above atmospheric pressure) relative to an external pressure in order to safeguard against outside gas or air from entering the interior should any leaks develop in a gas enclosure system. For example, under typical operation, for various examples of a gas enclosure system of the present teachings, the interior of a gas enclosure system can be maintained at a pressure relative to the surrounding atmosphere external to the enclosure system, for example, of at least 2 mbarg, for example, at a pressure of at least 4 mbarg, at a pressure of at least 6 mbarg, at a pressure of at least 8 mbarg, or at a higher pressure.

Maintaining a pressurized gas recirculation system within a gas enclosure system can be challenging, as it presents a dynamic and ongoing balancing act regarding maintaining a slight positive internal pressure of a gas enclosure system, while at the same time continuously introducing pressurized gas into a gas enclosure system. Further, variable demand of various devices and apparatuses can create an irregular pressure profile for various gas enclosure assemblies and systems of the present teachings. Maintaining a dynamic pressure balance for a gas enclosure system held at a slight positive pressure relative to the external environment under such conditions can provide for the integrity of an ongoing fabrication process. For various examples of a gas enclosure system, a pressurized gas recirculation system according to the present teachings can include various examples of a pressurized gas loop that can utilize at least one of a compressor, an accumulator, and a blower, and combinations thereof. Various examples of a pressurized gas recirculation system that include various examples of a pressurized gas loop can have a specially designed pressure-controlled bypass loop that can provide internal pressure of a non-reactive gas in a gas enclosure system of the present teachings at a stable, defined value. In various examples of a gas enclosure system, a pressurized gas recirculation system can be configured to re-circulate pressurized gas via a pressure-controlled bypass loop when a pressure of a gas in an accumulator of a pressurized gas loop exceeds a pre-set threshold pressure. The threshold pressure can be, for example, within a range from between about 25 psig to about 200 psig, or more specifically within a range of between about 75 psig to about 125 psig, or more specifically within a range from between about 90 psig to about 95 psig. In that regard, a gas enclosure system of the present teachings having a pressurized gas recirculation system with various examples of a specially designed pressure-controlled bypass loop can maintain a balance of having a pressurized gas recirculation system in an hermetically sealed gas enclosure.

According to the present teachings, various devices and apparatuses can be disposed in the interior of a gas enclosure system and in fluid communication with various examples of a pressurized gas recirculation system. For various examples of a gas enclosure and system of the present teachings, the use of various pneumatically operated devices and apparatuses can provide low-particle generating performance, as well as being low maintenance. Exemplary devices and apparatuses that can be disposed in the interior of a gas enclosure system and in fluid communication with various pressurized gas loops can include, for example, but not limited by, one or more of a pneumatic robot, a substrate floatation table, an air bearing, an air bushing, a compressed gas tool, a pneumatic actuator, and combinations thereof. A substrate floatation table, as well as air bearings can be used for various aspects of operating a printing system in accordance with various examples of a gas enclosure system of the present teachings. For example, a substrate floatation table utilizing air-bearing technology can be used to transport a substrate into position in a printhead chamber, as well as to support a substrate during a printing process.

For example, as shown in FIGS. 12A, 12B, 13A, and 13B, various examples of enclosed printing system 500D and enclosed printing system 500E can have external gas loop 3200 for integrating and controlling a non-reactive gas source 3201 and clean dry air (CDA) source 3203 for use in various aspects of operation of enclosed printing system 500D and enclosed printing system 500E. Enclosed printing system 500D and enclosed printing system 500E can also include various examples of an internal particle filtration and gas circulation system, as well as various examples of an external gas purification system, as described herein. Such examples of a gas enclosure system can include a gas purification system for purifying various reactive species from a gas. Some commonly used non-limiting examples of a non-reactive gas can include nitrogen, any of the noble gases, and any combination thereof. Various examples of a gas purification system according to the present teachings can maintain levels for each species of various reactive species, including various reactive atmospheric gases, such as water vapor, oxygen, ozone, as well as organic solvent vapors at 1000 ppm or lower, for example, at 100 ppm or lower, at 10 ppm or lower, at 1.0 ppm or lower, or at 0.1 ppm or lower. In addition to external loop 3200 for integrating and controlling gas source 3201 and CDA source 3203, enclosed printing system 500D and enclosed printing system 500E can have compressor loop 3250, which can supply gas for operating various devices and apparatuses that can be disposed in the interior of enclosed printing system 500D and enclosed printing system 500E. A vacuum system 3270 can be also be provided, such as in communication with gas enclosure assembly 1005 through line 3272 when valve 3274 is in an open position.

Compressor loop 3250 of FIG. 12A can include compressor 3262, first accumulator 3264 and second accumulator 3268, which are configured to be in fluid communication. Compressor 3262 can be configured to compress gas withdrawn from gas enclosure assembly 1005 to a desired pressure. An inlet side of compressor loop 3250 can be in fluid communication with gas enclosure assembly 1005 via gas enclosure assembly outlet 3252 through line 3254, having valve 3256 and check valve 3258. Compressor loop 3250 can be in fluid communication with gas enclosure assembly 1005 on an outlet side of compressor loop 3250 via external gas loop 3200. Accumulator 3264 can be disposed between compressor 3262 and the junction of compressor loop 3250 with external gas loop 3200 and can be configured to generate a pressure of 5 psig or higher. Second accumulator 3268 can be in compressor loop 3250 for providing dampening fluctuations due to compressor piston cycling at about 60 Hz. For various examples of compressor loop 3250, first accumulator 3264 can have a capacity of between about 80 gallons to about 160 gallons, while second accumulator can have a capacity of between about 30 gallons to about 60 gallons. According to various examples of enclosed printing system 500D, compressor 3262 can be a zero ingress compressor. Various types of zero ingress compressors can operate without leaking atmospheric gases into various examples of a gas enclosure system of the present teachings. Various examples of a zero ingress compressor can be run continuously, for example, during a fabrication process utilizing the use of various devices and apparatuses requiring compressed gas.

Accumulator 3264 can be configured to receive and accumulate compressed gas from compressor 3262. Accumulator 3264 can supply the compressed gas as needed in gas enclosure assembly 1005. For example, accumulator 3264 can provide gas to maintain pressure for various components of gas enclosure assembly 1005, such as, but not limited by, one or more of a pneumatic robot, a substrate floatation table, an air bearing, an air bushing, a compressed gas tool, a pneumatic actuator, and combinations thereof. As shown in FIG. 12A for enclosed printing system 500D, gas enclosure assembly 1005 can have printing system 2005 enclosed therein. As schematically depicted in FIG. 12A, printing system 2005 can be supported by printing system base 2150, which can be a granite stage. Printing system base 2150 can support a substrate support apparatus, such as a chuck, for example, but not limited by, a vacuum chuck, a substrate floatation chuck having pressure ports, and a substrate floatation chuck having vacuum and pressure ports. In various examples of the present teachings, a substrate support apparatus can be a substrate floatation table, such as substrate floatation table 2250. Substrate floatation table 2250 can be used for the frictionless support of a substrate. In addition to a low-particle generating floatation table, for frictionless Y-axis conveyance of a substrate, printing system 2005 can have a Y-axis motion system utilizing air bushings.

Additionally, printing system 2005 can have at least one X,Z-axis carriage assembly with motion control provided by a low-particle generating X-axis air bearing assembly. Various components of a low-particle generating motion system, such as an X-axis air bearing assembly, can be used in place of, for example, various particle-generating linear mechanical bearing systems. For various examples of a gas enclosure and system of the present teachings, the use of a variety of pneumatically operated devices and apparatuses can provide low-particle generating performance, as well as being low maintenance. Compressor loop 3250 can be configured to continuously supply pressurized gas to various devices and apparatuses of enclosed printing system 500D. In addition to a supply of pressurized gas, substrate floatation table 2250 of printing system 2005, which utilizes air bearing technology, also utilizes vacuum system 3270, which is in communication with gas enclosure assembly 1005 through line 3272 when valve 3274 is in an open position.

A pressurized gas recirculation system according to the present teachings can have pressure-controlled bypass loop 3260 as shown in FIG. 12A for compressor loop 3250, which acts to compensate for variable demand of pressurized gas during use, thereby providing dynamic balance for various examples of a gas enclosure system of the present teachings. For various examples of a gas enclosure system according to the present teachings, a bypass loop can maintain a constant pressure in accumulator 3264 without disrupting or changing the pressure in enclosure 1005. Bypass loop 3260 can have first bypass inlet valve 3261 on an inlet side of bypass loop, which is closed unless bypass loop 3260 is used. Bypass loop 3260 can also have back pressure regulator 3266, which can be used when second valve 3263 is closed. Bypass loop 3260 can have second accumulator 3268 disposed at an outlet side of bypass loop 3260. For examples of compressor loop 3250 utilizing a zero ingress compressor, bypass loop 3260 can compensate for small excursions of pressure that can occur over time during use of a gas enclosure system. Bypass loop 3260 can be in fluid communication with compressor loop 3250 on an inlet side of bypass loop 3260 when bypass inlet valve 3261 is in an opened position. When bypass inlet valve 3261 is opened, gas shunted through bypass loop 3260 can be recirculated to the compressor if gas from compressor loop 3250 is not in demand within the interior of gas enclosure assembly 1005. Compressor loop 3250 is configured to shunt gas through bypass loop 3260 when a pressure of the gas in accumulator 3264 exceeds a pre-set threshold pressure. A pre-set threshold pressure for accumulator 3264 can be from between about 25 psig to about 200 psig at a flow rate of at least about 1 cubic feet per minute (cfm), or from between about 50 psig to about 150 psig at a flow rate of at least about 1 cubic feet per minute (cfm), or from between about 75 psig to about 125 psig at a flow rate of at least about 1 cubic feet per minute (cfm) or between about 90 psig to about 95 psig at a flow rate of at least about 1 cubic feet per minute (cfm).

Various examples of compressor loop 3250 can utilize a variety of compressors other than a zero ingress compressor, such as a variable speed compressor or a compressor that can be controlled to be in either an on or off state. As previously discussed herein, a zero ingress compressor ensures that no atmospheric reactive species can be introduced into a gas enclosure system. As such, any compressor configuration preventing atmospheric reactive species from being introduced into a gas enclosure system can be utilized for compressor loop 3250. According to various examples, compressor 3262 of enclosed printing system 500D can be housed in, for example, but not limited by, an hermetically-sealed housing. The housing interior can be configured in fluid communication with a source of gas, for example, the same gas that forms the gas atmosphere for gas enclosure assembly 1005. For various examples of compressor loop 3250, compressor 3262 can be controlled at a constant speed to maintain a constant pressure. In other examples of compressor loop 3250 not utilizing a zero ingress compressor, compressor 3262 can be turned off when a maximum threshold pressure is reached, and turned on when a minimum threshold pressure is reached.

In FIG. 13A for enclosed printing system 500E, blower loop 3280 utilizing vacuum blower 3290 is shown for the operation of substrate floatation table 2250 of printing system 2005, which are housed in gas enclosure assembly 1005. As previously discussed herein for compressor loop 3250, blower loop 3280 can be configured to continuously supply pressurized gas to a substrate floatation table 2250 of printing system 2005.

Various examples of a gas enclosure system that can utilize a pressurized gas recirculation system can have various loops utilizing a variety of pressurized gas sources, such as at least one of a compressor, a blower, and combinations thereof. In FIG. 13A for enclosed printing system 500E, compressor loop 3250 can be in fluid communication with external gas loop 3200, which can be used for the supply of gas for high consumption manifold 3225, as well as low consumption manifold 3215. For various examples of a gas enclosure system according to the present teachings as shown in FIG. 13A for enclosed printing system 500E, high consumption manifold 3225 can be used to supply gas to various devices and apparatuses, such as, but not limited by, one or more of a substrate floatation table, a pneumatic robot, an air bearing, an air bushing, and a compressed gas tool, and combinations thereof. For various examples of a gas enclosure system according to the present teachings, low consumption 3215 can be used to supply gas to various apparatuses and devises, such as, but not limited by, one or more of an isolator, and a pneumatic actuator, and combinations thereof.

For various examples of enclosed printing system 500E of FIG. 13A and FIG. 13B, a blower loop 3280 can be utilized to supply pressurized gas to various examples of substrate floatation table 2250. In addition to a supply of pressurized gas, substrate floatation table 2250 of printing system 2005, which utilizes air bearing technology, also utilizes blower vacuum 3290, which is in communication with gas enclosure assembly 1005 through line 3292 when valve 3294 is in an open position. Housing 3282 of blower loop 3280 can maintain first blower 3284 for supplying a pressurized source of gas to substrate floatation table 2250, and second blower 3290, acting as a vacuum source for substrate floatation table 2250, which is housed in a gas environment in gas enclosure assembly 1005. Attributes that can make blowers suitable for use as a source of either pressurized gas or vacuum for various examples a substrate floatation table include, for example, but not limited by, that they have high reliability; making them low maintenance, have variable speed control, and have a wide range of flow volumes; various examples capable of providing a volume flow of between about 100 m³/h to about 2,500 m³/h. Various examples of blower loop 3280 additionally can have first isolation valve 3283 at an inlet end of blower loop 3280, as well as check valve 3285 and a second isolation valve 3287 at an outlet end of blower loop 3280. Various examples of blower loop 3280 can have adjustable valve 3286, which can be, for example, but not limited by, a gate, butterfly, needle or ball valve, as well as heat exchanger 3288 for maintaining gas from blower loop 3280 to substrate floatation table 2250 at a defined temperature.

FIG. 13A depicts external gas loop 3200, also shown in FIG. 12A, for integrating and controlling gas source 3201 and clean dry air (CDA) source 3203 for use in various aspects of operation of enclosed printing system 500D of FIG. 12A and enclosed printing system 500E of FIG. 13A. External gas loop 3200 of FIG. 12A and FIG. 13A can include at least four mechanical valves. These valves include first mechanical valve 3202, second mechanical valve 3204, third mechanical valve 3206, and fourth mechanical valve 3208. These various valves are located at positions in various flow lines that allow control of both a non-reactive gas and an air source such as clean dry air (CDA). According to the present teachings, a non-reactive gas can be any gas that does not undergo a chemical reaction under a defined set of conditions. Some commonly used non-limiting examples of non-reactive gas can include nitrogen, any of the noble gases, and any combination thereof. From a house gas source 3201, a house gas line 3210 extends. House gas line 3210 continues to extend linearly as low consumption manifold line 3212, which is in fluid communication with low consumption manifold 3215. A cross-line first section 3214 extends from a first flow juncture 3216, which is located at the intersection of house gas line 3210, low consumption manifold line 3212, and cross-line first section 3214. Cross-line first section 3214 extends to a second flow juncture 3218. A compressor gas line 3220 extends from accumulator 3264 of compressor loop 3250 and terminates at second flow juncture 3218. A CDA line 3222 extends from a CDA source 3203 and continues as high consumption manifold line 3224, which is in fluid communication with high consumption manifold 3225. A third flow juncture 3226 is positioned at the intersection of a cross-line second section 3228, clean dry air line 3222, and high consumption manifold line 3224. Cross-line second section 3228 extends from second flow juncture 3218 to third flow juncture 3226. Various components that are high consumption can be supplied CDA during maintenance, by means high consumption manifold 3225. Isolating the compressor using valves 3204, 3208, and 3230 can prevent reactive species, such as ozone, oxygen, and water vapor from contaminating a gas within the compressor and accumulator.

By contrast with FIGS. 12A and 13A, FIGS. 12B and 13B illustrate generally a configuration wherein a pressure of gas inside the gas enclosure assembly 1005 can be maintained within a desired or specified range, such as using a valve coupled to a pressure monitor, P, where the valve allows gas to be exhausted to another enclosure, system, or a region surrounding the gas enclosure assembly 1005 using information obtained from the pressure monitor. Such gas can be recovered and re-processed as in other examples described herein. As mentioned above, such regulation can assist in maintaining a slight positive internal pressure of a gas enclosure system, because pressurized gas is also contemporaneously introduced into the gas enclosure system. Variable demand of various devices and apparatuses can create an irregular pressure profile for various gas enclosure assemblies and systems of the present teachings. Accordingly, the approach shown in FIGS. 12B and 13B can be used in addition or instead of other approaches described herein such as to assist in maintaining a dynamic pressure balance for a gas enclosure system held at a slight positive pressure relative to the environment surrounding the enclosure.

FIG. 14 illustrates generally a further example of a system 500F for integrating and controlling one or more gas or air sources, such as to establish floatation control zones included as a portion of a floatation conveyance system. Similar to the examples of FIG. 3, FIG. 13A and FIG. 13B, FIG. 14 illustrates generally floatation table 2250. Additionally, shown in the illustrative example of FIG. 14 are an input region 2201 and an output region 2203. The regions 2201, 2200, 2203 are referred to as input, printing, and output for illustration only. Such regions can be used for other processing steps, such as conveyance of a substrate, or support of a substrate such as during one or more of holding, drying, or thermal treatment of the substrate in one or more other modules. In the illustration of FIG. 14, a first blower 3284A is configured to provide pressurized gas in one or more of the input or output regions 2201 or 2203 of a floatation table apparatus. Such pressurized gas can be temperature controlled such as using a first chiller 142A coupled to a first heat exchanger 1502A. Such pressurized gas can be filtered using a first filter 1503A. A temperature monitor 8701A can be coupled to the first chiller 142 (or other temperature controller).

Similarly, a second blower 3284B can be coupled to the printing region 2202 of the floatation table. A separate chiller 142B can be coupled to a loop including a second heat exchanger 1502B and a second filter 1503B. A second temperature monitor 8701B can be used to provide independent regulation of the temperature of pressurized gas provided by the second blower 3284B. In this illustrative example, as described herein for FIG. 3, the input and output regions 2201 and 2203 are supplied with positive pressure, but the printing region 2202 can include use of a combination of positive pressure and vacuum control to provide precise control over the substrate position. For example, using such a combination of positive pressure and vacuum control, the substrate can be exclusively controlled using the floating gas cushion provided by enclosure printing system 500F in the zone defined by the printing region 2202. The vacuum can be established by a third blower 3290, such as also provided at least a portion of the make-up gas for the first and second blowers 3284A or 3284B within the blower housing 3282.

It should be understood that various alternatives to the embodiments of the disclosure described herein may be employed in practicing the disclosure. For example, embodiments of an enclosed printing system according to the present teachings can be useful for patterned area printing of substrates in the manufacture of a variety of devices and apparatuses in a wide range of technology areas, for example, but not limited by, OLED displays, OLED lighting, organic photovoltaics, Perovskite solar cells, and organic semiconductor circuits. Additionally, vastly different arts such as chemistry, biotechnology, high technology and pharmaceutical arts may benefit from the present teachings. Printing is used to exemplify the utility of various embodiments of a gas enclosure system according to the present teachings. Various embodiments of a gas enclosure system that may house a printing system can provide features such as, but not limited by, sealing providing an hermetic-sealed enclosure through cycles of construction and deconstruction, minimization of enclosure volume, and ready access from the exterior to the interior during processing, as well as during maintenance. Such features of various embodiments of a gas enclosure system may have an impact on functionality, such as, but not limited by, structural integrity providing ease of maintaining low levels of reactive species and particulate matter during processing, as well as rapid enclosure-volume turnover minimizing downtime during maintenance cycles. As such, various features and specifications providing utility for substrate printing may also provide benefit to a variety of technology areas.

While embodiments of the present disclosure have been shown and described herein, it will be obvious to those skilled in the art that such embodiments are provided by way of example only. Numerous variations, changes, and substitutions will now occur to those skilled in the art without departing from the disclosure. It is intended that the following claims define the scope of the disclosure and that methods and structures within the scope of these claims and their equivalents be covered thereby.

What is claimed is:

1. A method for printing a substrate, the method comprising:
    positioning a substrate within an enclosure enclosing a printing system, wherein the printing system comprises a printhead device assembly comprising at least one printhead;
    performing a printing process on the substrate, wherein the printing process comprises:
        supplying ink from a local ink dispensing reservoir to the printhead device assembly, the local ink dispensing reservoir located inside the enclosure,
        supplying ink from a local ink replenishment reservoir to the local ink dispensing reservoir so as to maintain, in the local ink dispensing reservoir, a level of ink within a first predetermined range, the local ink dispensing reservoir located inside the enclosure,
        supplying ink from a bulk ink delivery system, through a fluid line disposed inside an outer conduit, and to the local ink replenishment reservoir so as to maintain, in the local ink replenishment reservoir, a level of ink within a second predetermined range, the bulk ink delivery system located outside the enclosure, and
        depositing ink from the at least one printhead on the substrate.

2. The method of claim 1, wherein supplying ink from the local ink replenishment reservoir to the local ink dispensing reservoir comprises supplying ink from the local ink replenishment reservoir to the local ink dispensing reservoir when the level of ink in the local ink dispensing reservoir falls below a first predetermined lower level of the first predetermined range.

3. The method of claim 2, wherein supplying ink from the bulk ink delivery system to the local ink replenishment reservoir comprises supplying ink from the bulk ink delivery system to the local ink replenishment reservoir when the level of ink in the local ink replenishment reservoir falls below a second predetermined lower level of the second predetermined range.

4. The method of claim 1, wherein:
    the printhead device assembly comprises a plurality of printheads including the at least one printhead, and
    supplying ink from the local ink dispensing reservoir to the printhead device assembly comprises supplying ink from the local ink dispensing reservoir to a printhead device assembly supply manifold operably coupled to the plurality of printheads.

5. The method of claim 4, wherein supplying ink from the local ink dispensing reservoir to the printhead device assembly supply manifold comprises supplying ink from an outlet line of the local ink dispensing reservoir to a plurality of supply manifold inlet lines.

6. The method of claim 5, further comprising supplying ink from the plurality of supply manifold inlet lines to the plurality of printheads.

7. The method of claim 6, further comprising directing a portion of the ink supplied to the plurality of printheads to a printhead device assembly return manifold.

8. The method of claim 7, further comprising directing the portion of the ink from the printhead device assembly return manifold to a printhead device assembly output waste line fluidically coupled to the printhead device assembly return manifold through a plurality of return manifold outlet lines.

9. The method of claim 1, further comprising directing waste ink not deposited on the substrate in performing the printing process to a bulk waste assembly located outside the enclosure, wherein the outer conduit is fluidically coupled to the bulk waste assembly.

10. The method of claim 1, wherein ink deposited from the at least one printhead comprises an organic material used to form a layer of an organic light emitting device (OLED).

11. The method of claim 1, wherein depositing ink from the at least one printhead comprises depositing ink using at least one inkjet printhead.

12. The method of claim 1, wherein depositing ink from the at least one printhead comprises depositing ink in a pattern on the substrate.

13. The method of claim 1, further comprising maintaining a controlled environment in the enclosure while performing the printing process.

14. The method of claim 13, wherein maintaining the controlled environment comprises maintaining an inert gas environment in the enclosure.

15. The method of claim 14, wherein the inert gas environment comprises a gas chosen from nitrogen, any of the noble gases, and any combination thereof.

16. A method for printing a substrate, the method comprising:
  positioning a substrate within an enclosure enclosing a printing system, wherein the printing system comprises a printhead device assembly comprising at least one printhead; and
  performing a printing process on the substrate, wherein the printing process comprises:
    depositing ink from the at least one printhead onto the substrate;
    controlling a supply of ink to a local ink dispensing reservoir located in the enclosure and fluidically coupled to supply ink to the at least one printhead, the controlling the supply of ink to the local ink dispensing reservoir comprising:
      in response to sensing a level of ink in the local ink dispensing reservoir is at or below a first predetermined lower level of a first predetermined range, supplying ink from a local ink replenishment reservoir to the local ink dispensing reservoir, the local ink replenishment reservoir located inside the enclosure, and
      in response to sensing the level of ink in the local ink dispensing reservoir is at or above a first predetermined upper level of the first predetermined range, ceasing supplying ink from a local ink replenishment reservoir to the local ink dispensing reservoir.

17. The method of claim 16, wherein the printing process further comprises:
  controlling a supply of ink to the local ink replenishment reservoir, the controlling the supply of ink to the local ink replenishment reservoir comprising:
    in response to sensing a level of ink in the local ink replenishment reservoir is at or below a second predetermined lower level of a second predetermined range, supplying ink from a bulk ink delivery reservoir to the local ink replenishment reservoir, the bulk ink delivery reservoir located outside the enclosure, and
    in response to sensing the level of ink in the local ink replenishment reservoir is at or above a second predetermined upper level of the second predetermined range, ceasing supplying ink to the local ink replenishment reservoir from the bulk ink delivery reservoir.

18. The method of claim 16, wherein:
  the printhead device assembly comprises a plurality of printheads including the at least one printhead, and
  supplying ink from the local ink dispensing reservoir to the at least one printhead comprises supplying ink from the local ink dispensing reservoir to the plurality of printheads.

19. The method of claim 18, wherein supplying ink from the local ink dispensing reservoir to the plurality of printheads comprises supplying ink from an outlet line of the local ink dispensing reservoir to a plurality of supply manifold inlet lines fluidically coupled with the plurality of printheads.

20. The method of claim 16, further comprising maintaining a controlled environment in the enclosure while performing the printing process.

21. The method of claim 20, wherein maintaining the controlled environment comprises maintaining an inert gas environment in the enclosure.

22. The method of claim 21, wherein the inert gas environment comprises a gas chosen from nitrogen, any of the noble gases, and any combination thereof.

* * * * *